US011133225B2

(12) United States Patent
Drake et al.

(10) Patent No.: US 11,133,225 B2
(45) Date of Patent: Sep. 28, 2021

(54) MODE CONVERTER AND METHOD OF FABRICATING THEREOF

(71) Applicant: ROCKLEY PHOTONICS LIMITED, London (GB)

(72) Inventors: John Drake, St. Ives (GB); Damiana Lerose, Pasadena, CA (US); Henri Nykänen, Helsinki (FI); Gerald Cois Byrd, Shadow Hills, CA (US)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 16/865,255

(22) Filed: May 1, 2020

(65) Prior Publication Data
US 2020/0258791 A1  Aug. 13, 2020

Related U.S. Application Data

(63) Continuation of application No. 16/317,151, filed as application No. PCT/GB2017/052065 on Jul. 13, 2017, now Pat. No. 10,643,903.

(Continued)

(51) Int. Cl.
*H01L 21/8238* (2006.01)
*G02B 6/136* (2006.01)
(Continued)

(52) U.S. Cl.
CPC ........ *H01L 21/823821* (2013.01); *G02B 6/12* (2013.01); *G02B 6/131* (2013.01); *G02B 6/136* (2013.01); *G02B 6/305* (2013.01); *H01L 21/8258* (2013.01); *G02B 6/12004* (2013.01); *G02B 6/1223* (2013.01); *G02B 6/132* (2013.01); *G02B 6/1347* (2013.01); *G02B 6/42* (2013.01); *G02B 2006/121* (2013.01); *G02B 2006/12038* (2013.01); *G02B 2006/12061* (2013.01); *G02B 2006/12097* (2013.01); *G02B 2006/12147* (2013.01); *G02B 2006/12152* (2013.01);
(Continued)

(58) Field of Classification Search
None
See application file for complete search history.

(56) References Cited

U.S. PATENT DOCUMENTS 5,787,214 A  7/1998 Harpin et al.
6,013,936 A  1/2000 Colt, Jr.
(Continued)

OTHER PUBLICATIONS

Chinese Notification of the Second Office Action, for Patent Application No. CN 201780043323.0, dated Aug. 7, 2020, 7 pages.
(Continued)

*Primary Examiner* — Jerry Rahll
(74) *Attorney, Agent, or Firm* — Lewis Roca Rothgerber Christie LLP

(57) ABSTRACT

An optical fiber adapter and method of fabricating the same from a wafer including a double silicon-on-insulator layer structure. The optical fiber adapter may include a mode converter, a trench, and a V-groove, the V-groove and the trench operating as passive alignment features for an optical fiber, in the transverse translational and rotational degrees of freedom, and in the longitudinal translational degree of freedom, respectively. The mode converter may include a buried tapered waveguide.

20 Claims, 21 Drawing Sheets

Related U.S. Application Data

(60) Provisional application No. 62/362,012, filed on Jul. 13, 2016.

(51) Int. Cl.
    *G02B 6/13*         (2006.01)
    *H01L 21/8258*    (2006.01)
    *G02B 6/12*         (2006.01)
    *G02B 6/30*         (2006.01)
    G02B 6/42         (2006.01)
    G02B 6/122       (2006.01)
    H01L 21/762     (2006.01)
    G02B 6/132       (2006.01)
    G02B 6/134       (2006.01)
    H01S 5/02        (2006.01)

(52) U.S. Cl.
CPC .............. *G02B 2006/12176* (2013.01); *G02B 2006/12178* (2013.01); *G02B 2006/12195* (2013.01); *H01L 21/7624* (2013.01); *H01L 21/76224* (2013.01); *H01L 21/76264* (2013.01); *H01S 5/021* (2013.01); *H01S 5/0216* (2013.01)

(56) References Cited

U.S. PATENT DOCUMENTS

| | | | |
|---|---|---|---|
| 6,108,478 A | 8/2000 | Harpin et al. | |
| 6,231,771 B1 | 5/2001 | Drake | |
| 6,316,281 B1* | 11/2001 | Lee | H01L 31/02325 438/31 |
| 6,509,139 B1 | 1/2003 | Roberts et al. | |
| 6,556,759 B2 | 4/2003 | Roberts et al. | |
| 7,469,084 B2 | 12/2008 | Aalto | |
| 8,000,565 B2 | 8/2011 | Liu | |
| 10,317,620 B2* | 6/2019 | Rickman | G02B 6/122 |
| 2002/0131747 A1 | 9/2002 | Roberts et al. | |
| 2015/0253472 A1 | 9/2015 | Kumar et al. | |
| 2015/0293299 A1 | 10/2015 | Xu et al. | |
| 2016/0377806 A1 | 12/2016 | Ellis-Monaghan et al. | |
| 2019/0243070 A1* | 8/2019 | Drake | H01L 21/8258 |

OTHER PUBLICATIONS

Partial English translation of the Chinese Notification of the First Office Action, for Patent Application No. CN 201780043323.0, dated Aug. 7, 2020, 11 pages.

International Search Report and Written Opinion of the International Searching Authority, dated Oct. 17, 2017, Corresponding to PCT/GB2017/052065, 16 pages.

U.K. Intellectual Property Office Examination Report, dated Jul. 26, 2018, for Patent Application No. GB1711258.2, 7 pages.

U.K. Intellectual Property Office Examination Report, dated Dec. 12, 2018, for Patent Application No. GB1711258.2, 7 pages.

U.K. Intellectual Property Office Examination Report, dated Jun. 20, 2019, for Patent Application No. GB1711258.2, 3 pages.

U.K. Intellectual Property Office Search Report, dated Jul. 25, 2017, for Patent Application No. GB1711258.2, 3 pages.

Chinese Notification of the First Office Action, for Patent Application No. 201780043323.0, dated Feb. 18, 2020, 10 pages.

Partial English translation of the Chinese Notification of the First Office Action, for Patent Application No. 201780043323.0, dated Feb. 18, 2020, 16 pages.

* cited by examiner

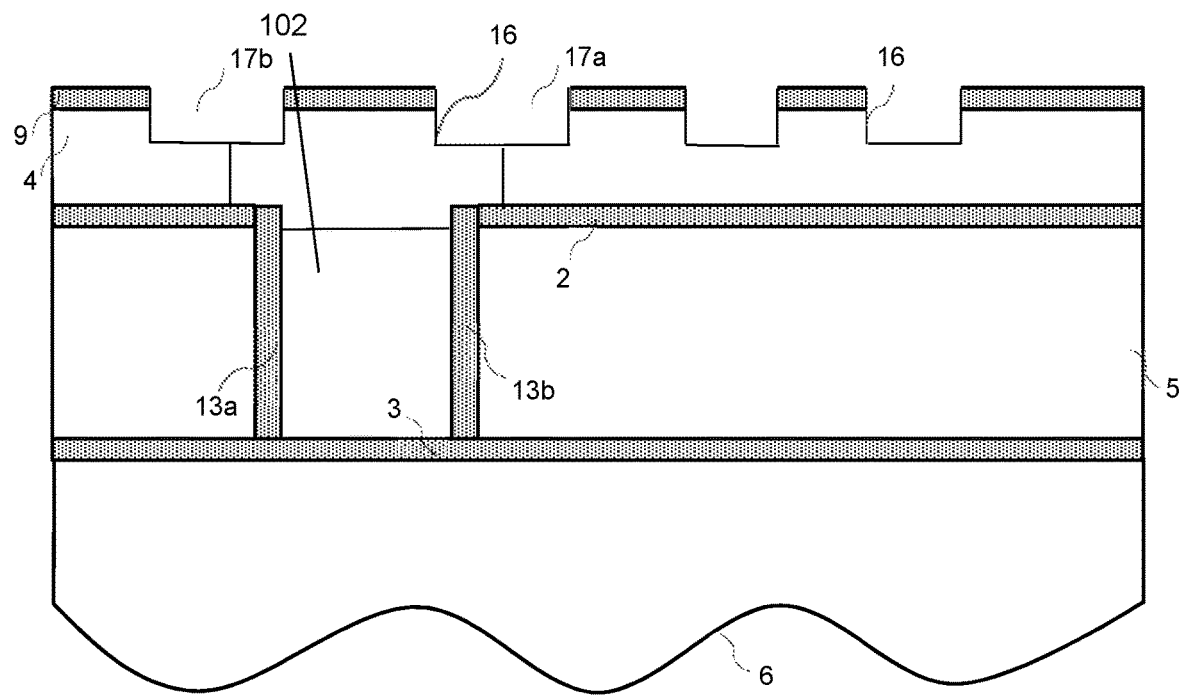
Fig. 6M(i)
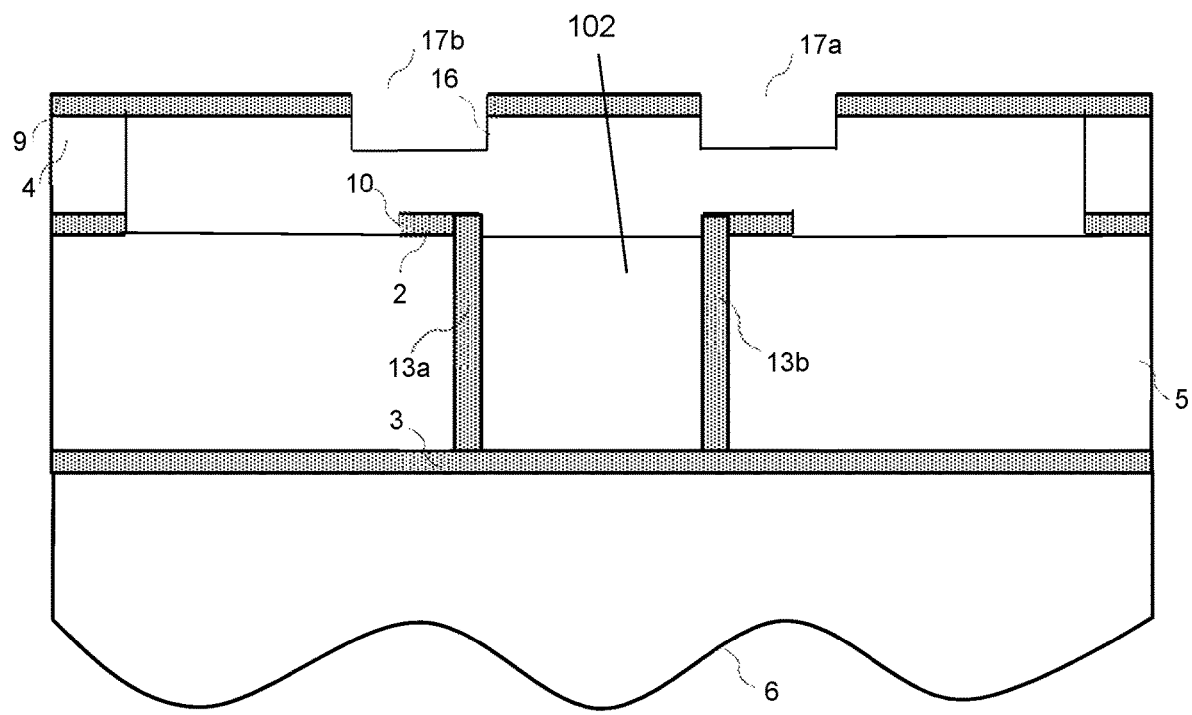
Fig. 6M(ii)

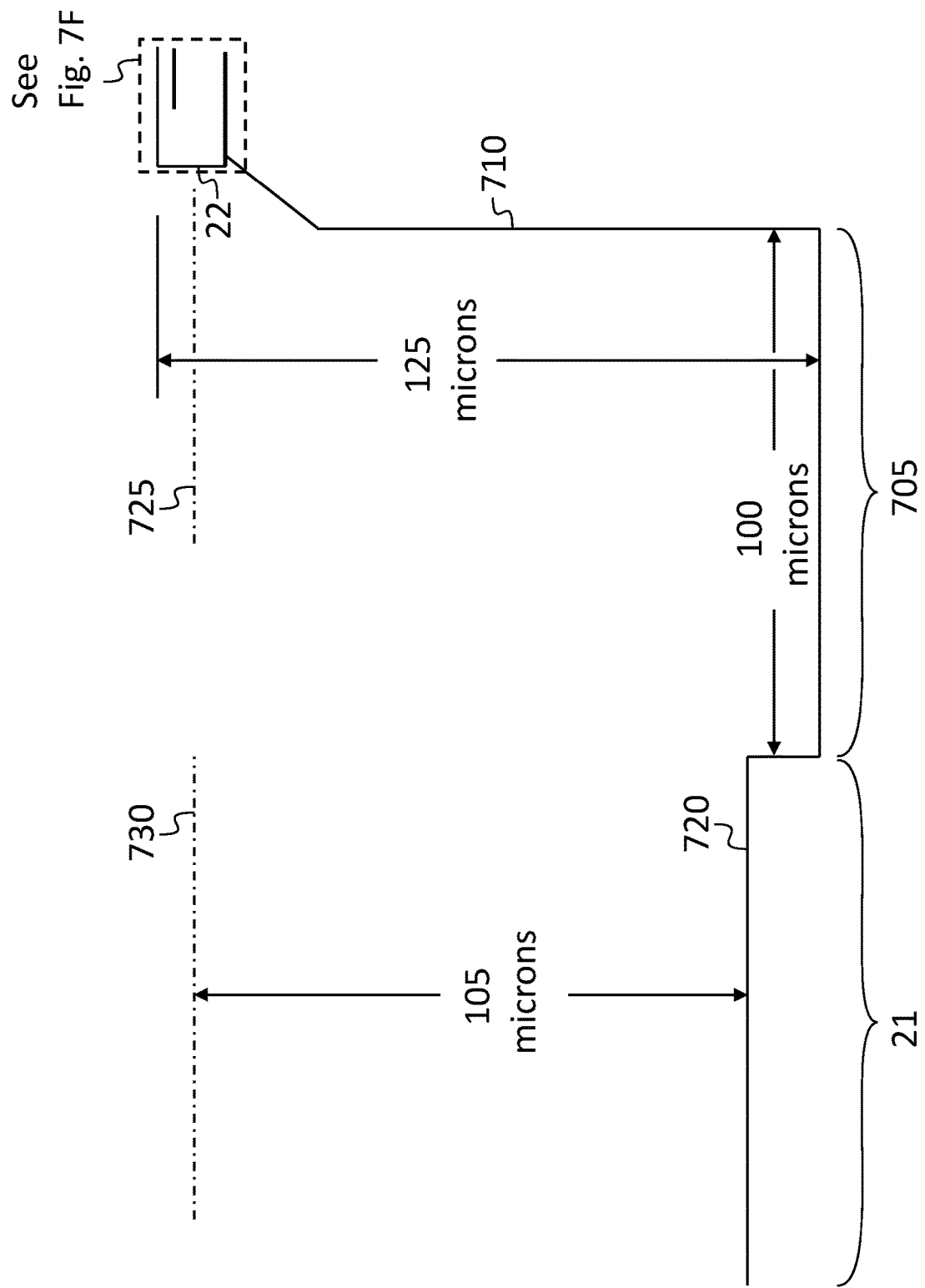

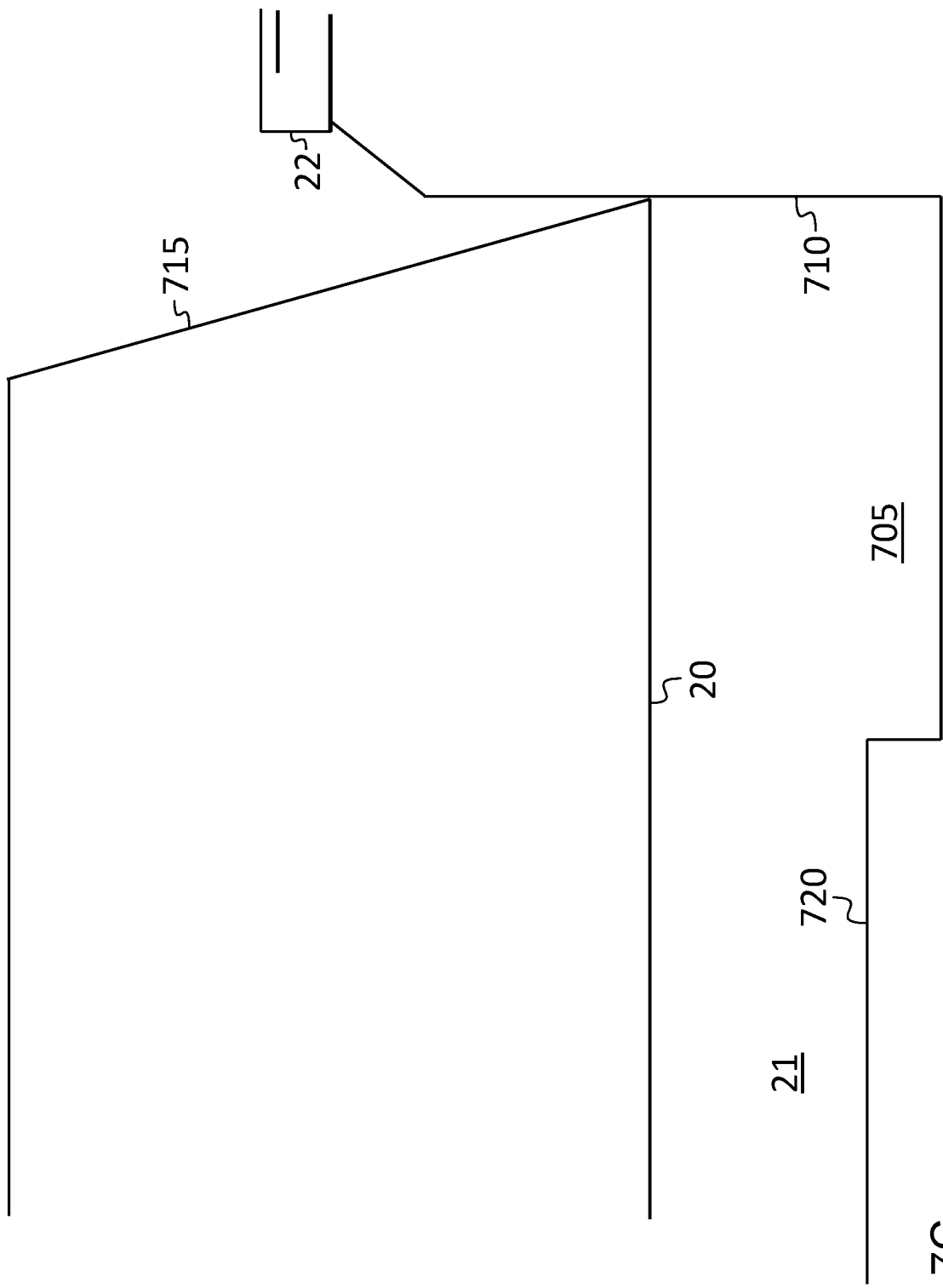

MODE CONVERTER AND METHOD OF FABRICATING THEREOF

CROSS-REFERENCE TO RELATED APPLICATION(S)

This application is a continuation-in-part of U.S. patent application Ser. No. 16/317,151, filed Jan. 11, 2019, which is a U.S. National Stage Patent Application of International Patent Application Number PCT/GB2017/052065, filed on Jul. 13, 2017, which claims priority to and the benefit of U.S. Provisional Patent Application No. 62/362,012, filed on Jul. 13, 2016, the entire contents of all of which are incorporated herein by reference.

FIELD

The present invention relates to a mode converter and method of fabricating thereof, and particularly mode converters fabricated using, for example, substrates with double silicon on insulator layers.

BACKGROUND

The size of an optical mode within a photonic integrated circuit (PIC) is generally much smaller than the optical mode of a connected fiber optic cable. For example, the optical mode within a fiber optic cable may be around 13 μm×13 μm. Whereas the optical mode within the PIC may be typically a few microns or less. This mismatch in optical mode can lead to coupling losses when connecting the PIC to the fiber optic cable.

Generally increasing the mode size of the optical mode within the PIC is not a viable solution, as the resulting optical circuit would be unfeasibly large.

Known in the prior art are mode converters, which convert the optical mode of the fiber optic cable to that of the optical mode within the PIC (and vice versa). Generally, mode converters in the prior art fall within two categories:

(1) Converters which involve modified fiber profiles (for example, lensed or tapered fibers) and active alignment to the PIC via fibers mounted in a fiber block.
(2) Providing a tapered waveguide within the PIC, with integrated v-grooves for passive alignment or fiber attach via a separate fiber block.

Mode converters falling within category (1) generally demand very tight fiber alignment tolerances, and packaging costs can be high due to the increased number of parts and the labour of precise active alignment of the fiber block to the PIC.

Whereas mode converters falling within category (2) generally result in a large variation in the topography of a PIC, due to the relatively large height of the mode converter in contrast to the remaining components on the PIC. This variation in topography can be challenging when it comes to photolithographic processes used in fabrication as it can degrade the dimensional control of the other components on the PIC. The invention aims to provide a manufacturable method of fabricating a low loss, passively aligned PIC without the topography limitations of the prior art

SUMMARY

At its broadest, the invention provides a method of manufacturing a monolithic optical mode converter using a double silicon-on-insulator structure, where the mode converter is buried relative to an upper surface of the wafer.

In a first aspect, the present invention provides a method of fabricating an optical mode converter from a wafer including a double silicon-on-insulator (DSOI) layer structure, comprising the steps of: providing a first mask over a portion of a device layer of the DSOI layer structure; etching an unmasked portion of the device layer down to at least an upper buried oxide layer, to provide a cavity; etching a first isolation trench and a second isolation trench into a mode converter layer, the mode converter layer being: on an opposite side of the upper buried oxide layer to the device layer and between the upper buried oxide layer and a lower buried oxide layer, the lower buried oxide layer being above a substrate; wherein the first isolation trench and the second isolation trench define a tapered waveguide; filling the first isolation trench and the second isolation trench with an insulating material, so as to optically isolate the tapered waveguide from the remaining mode converter layer; and regrowing the etched region of the device layer.

Advantageously, such a method improves the dimensional tolerances of the device and integrated components. Moreover, the uniformity in the thickness of the device layer (which is high as a result of using a pre-fabricated DSOI wafer) is not compromised by fabrication of the mode converter.

In a second aspect, the present invention provides an optical mode converter, formed on a wafer including a double silicon-on-insulator (DSOI) layer structure, comprising: a substrate, above which is a lower buried oxide layer; a mode converter layer, which is above the lower buried oxide layer, and includes: a tapered waveguide, cladded by an insulator disposed in a first isolation trench and a second isolation trench; and a bulk region, adjacent to the insulator and on an opposing side thereof to the tapered waveguide, formed of a same material as the tapered waveguide; an upper buried oxide layer, which is above the mode converter layer and has an opening therein above the tapered waveguide; and a device layer, which is above the upper buried oxide layer; wherein the device layer includes two etched portions which define a rib waveguide, and an uppermost surface of the rib waveguide is co-planar with an uppermost surface of the device layer.

Optional features of the invention will now be set out. These are applicable singly or in any combination with any aspect of the invention.

The wafer may be a double silicon-in-insulator wafer. The method may include a step of etching a rib waveguide from the regrown region of the device layer.

The step of etching the unmasked portion of the device layer down to at least the upper buried oxide layer may include: a first etching step, etching from an upper surface of the device layer to an upper surface of the upper buried oxide layer; and a second etching step, etching from an upper surface of the upper buried oxide layer to an upper surface of the mode converter layer. The second etching step may include not removing all of the buried oxide in the cavity. For example, a portion of the buried oxide may be retained on opposing sides of the cavity.

The method may further comprise a step, between the steps of etching the unmasked portion and etching the first and second isolation trenches, of: depositing an oxidation barrier over: (i) the first mask and (ii) the cavity, wherein the cavity is defined by sidewalls and a bed. The step of filling the first isolation trench and the second isolation trench may include thermally oxidising the mode converter layer, so as to fill the first isolation trench and the second isolation trench with an oxide.

The method may include a step, after regrowing the etch region of the device layer, of: planarizing the regrown region of the device layer such that it is coplanar with an uppermost surface of the unetched region of the device layer.

The first tapered waveguide may be provided with a first width of between 9 µm and 15 µm and a second width of less than 1 µm.

A width of the cavity etched may be substantially wider than a widest width of the tapered waveguide.

The method may further comprise a step of: etching a v-groove interface at a first end of the mode converter, such that an input facet of the tapered waveguide overhangs the v-groove interface, so as to allow passive alignment of a fiber optical cable to the tapered waveguide.

The method may further comprise a step of polishing a first end of the mode converter, so as to provide a planar input facet for active alignment to a fiber optic cable.

The insulator disposed within the first isolation trench and the second isolation trench may be silicon dioxide. The first isolation trench and the second isolation trench may respectively have a width of between 0.4 µm and 1.0 µm.

According to an embodiment of the present invention, there is provided an optical fiber adapter, formed on a wafer including a double silicon-on-insulator (DSOI) layer structure, the optical fiber adapter including: a substrate, above which is a lower buried oxide layer; a mode converter layer, which is above the lower buried oxide layer, and includes a tapered waveguide, cladded on a first side of the tapered waveguide by a first cladding layer, and cladded on a second side of the tapered waveguide by a second cladding layer; an upper buried oxide layer, which is above the mode converter layer and has an opening therein above the tapered waveguide; a device layer, which is above the upper buried oxide layer, and includes two etched portions which define a rib waveguide; a waveguide facet at an end of the tapered waveguide and the rib waveguide; and a V-groove, the V-groove being configured to support an optical fiber having an optical mode overlapping the waveguide facet.

In some embodiments, the optical fiber adapter further includes a trench having a first wall, the first wall being configured to position a fiber end facet abutting against the first wall to be separated from the waveguide facet by a gap.

In some embodiments, the gap is greater than 3 microns and less than 100 microns.

In some embodiments, the trench is perpendicular, to within 20 degrees, of the V-groove.

In some embodiments, the trench has a depth of between 100 microns and 200 microns, and a width of between 50 microns and 150 microns.

In some embodiments, an angle between the waveguide facet and a plane perpendicular to the V-groove is at least 0.5 degrees.

In some embodiments, the angle between the waveguide facet and the plane perpendicular to the V-groove is at most 6 degrees.

In some embodiments, an angle between: the V-groove and a centerline of the rib waveguide and the tapered waveguide is at least 1 degree.

In some embodiments, the ratio of the sine of the angle between the waveguide facet and the plane perpendicular to the V-groove and the sine of the angle between a line perpendicular to the waveguide facet and a centerline of the rib waveguide and the tapered waveguide is within 20% of 2.2.

In some embodiments, the optical fiber adapter further includes a trench having a first wall, the first wall being configured to position a fiber end facet abutting against the first wall to be separated from the waveguide facet by a gap.

In some embodiments, the gap is greater than 3 microns and less than 100 microns. In some embodiments, the trench is perpendicular, to within 20 degrees, of the V-groove. In some embodiments, the trench has a depth of between 100 microns and 200 microns, and a width of between 50 microns and 150 microns.

According to an embodiment of the present invention, there is provided a system, including: an optical fiber adapter; and an optical fiber, in the V-groove, the system being configured to couple light between the optical fiber, and the tapered waveguide and the rib waveguide; with an insertion loss of less than 2 dB.

In some embodiments: the optical fiber adapter further includes a trench having a first wall, and the optical fiber has a fiber end facet abutting against the first wall.

In some embodiments, an angle between the waveguide facet and a plane perpendicular to the V-groove is at least 0.5 degrees.

In some embodiments, an angle between: the V-groove, and a centerline of the rib waveguide and the tapered waveguide is at least 1 degree.

In some embodiments, an optical return loss for light propagating in the tapered waveguide and the rib waveguide toward the waveguide facet is greater than 10 dB.

In some embodiments, the optical fiber has a fiber end facet, an angle between a normal vector of the fiber end facet and the optical fiber being at least 0.5 degrees.

In some embodiments, an optical return loss for light propagating in the optical fiber toward the fiber end facet is greater than 15 dB.

BRIEF DESCRIPTION OF THE DRAWINGS

Embodiments of the invention will now be described by way of example with reference to the accompanying drawings in which:

FIG. 7A shows a schematic side view of an optical fiber adapter;

FIG. 7C shows a schematic side view of an optical fiber adapter;

DETAILED DESCRIPTION

Figure 1A:
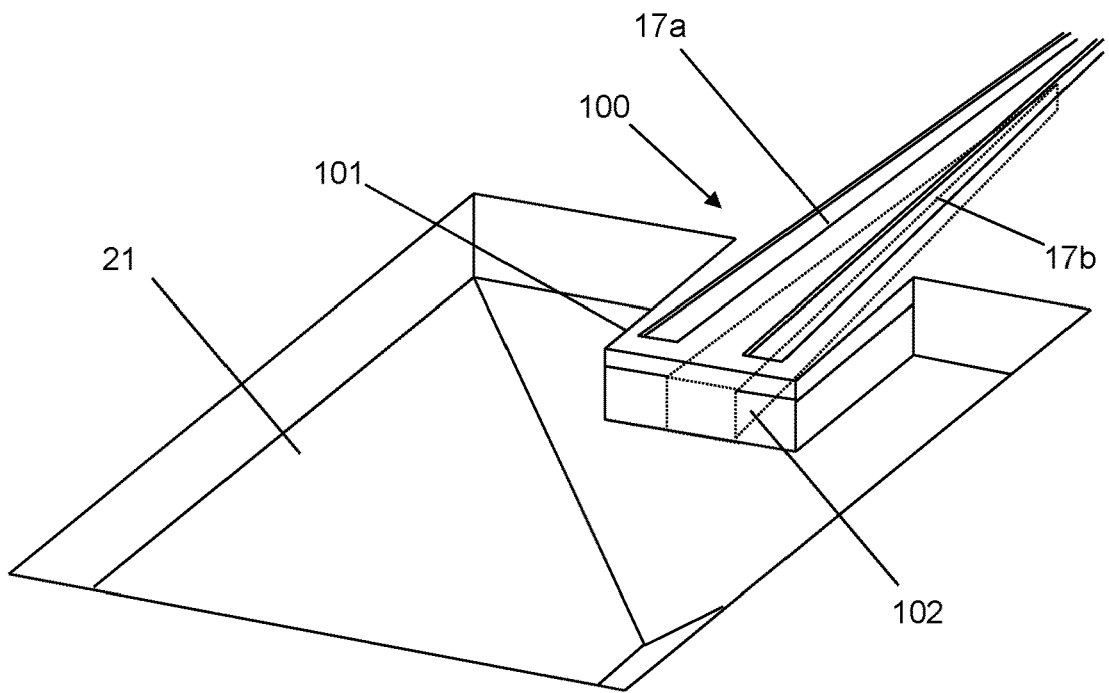
FIGS. 1A and 1B show a mode converter according to the present invention.

FIG. 1A shows a perspective view of a mode converter 100 according to the present invention. In this example, the mode converter is passively connectable to a fiber optic cable, via V-groove 21. The V-groove allows a mechanical alignment of a fiber optic cable with an overhanging portion 101 of the mode converter.

Figure 1B:
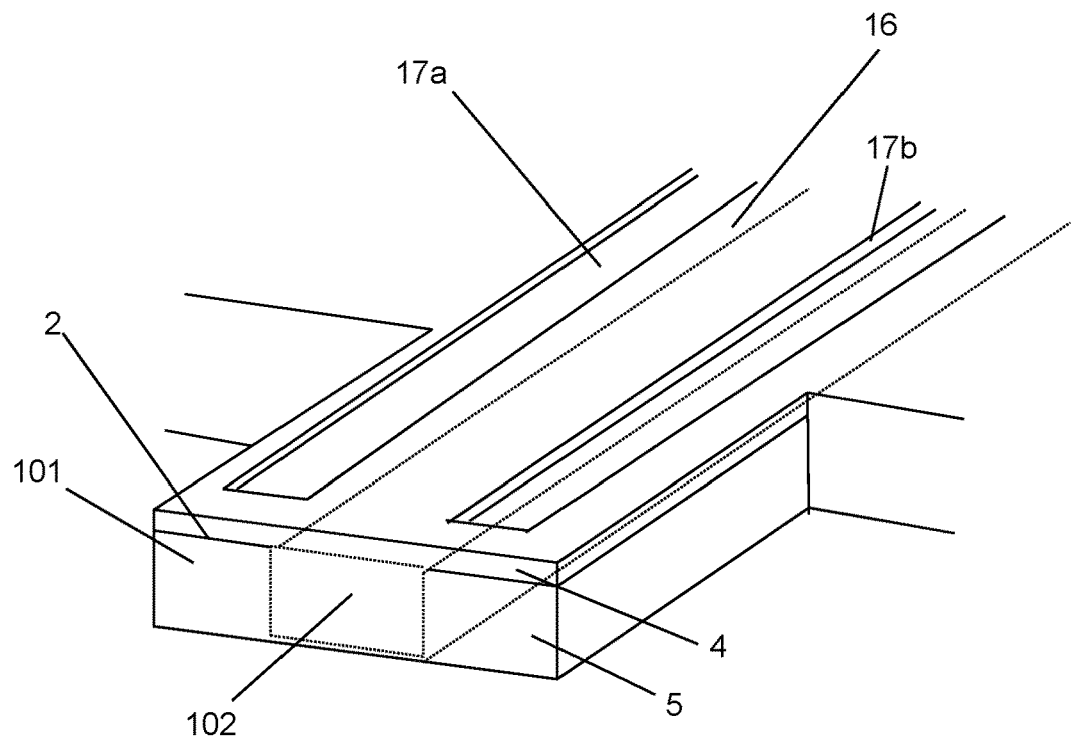

As is shown more clearly in FIG. 1B, the overhanging portion 101 includes a tapered waveguide 102 which tapers horizontally. The tapered waveguide 102 can be described has being generally a triangular prism. The tapered waveguide is disposed within a mode converter layer 5 of the mode converter, above which is a device layer 4. The device layer and mode converter layer are separated by a second or upper buried oxide layer 2. In the device layer is a rib waveguide 16 which is defined by two channels 17a and 17b (each channel forming a respective sidewall 24a, 24b (FIG. 3A) of the rib waveguide 16) which have been etched into an uppermost surface of the device layer. The channels are etched to provide a tapering to the rib waveguide, such that it narrows in width along its length. The tapering of both the tapered waveguide 102 and rib waveguide 16 allow the mode converter to convert an optical mode within a fiber optic cable to an optical mode within a photonic integrated circuit.

Because the tapered waveguide 102 is positioned below the device layer 4, it may be referred to as a buried tapered waveguide. The length of the tapered waveguide and the rib waveguide can be tuned so as to achieve low loss coupling therebetween.

Figure 2:
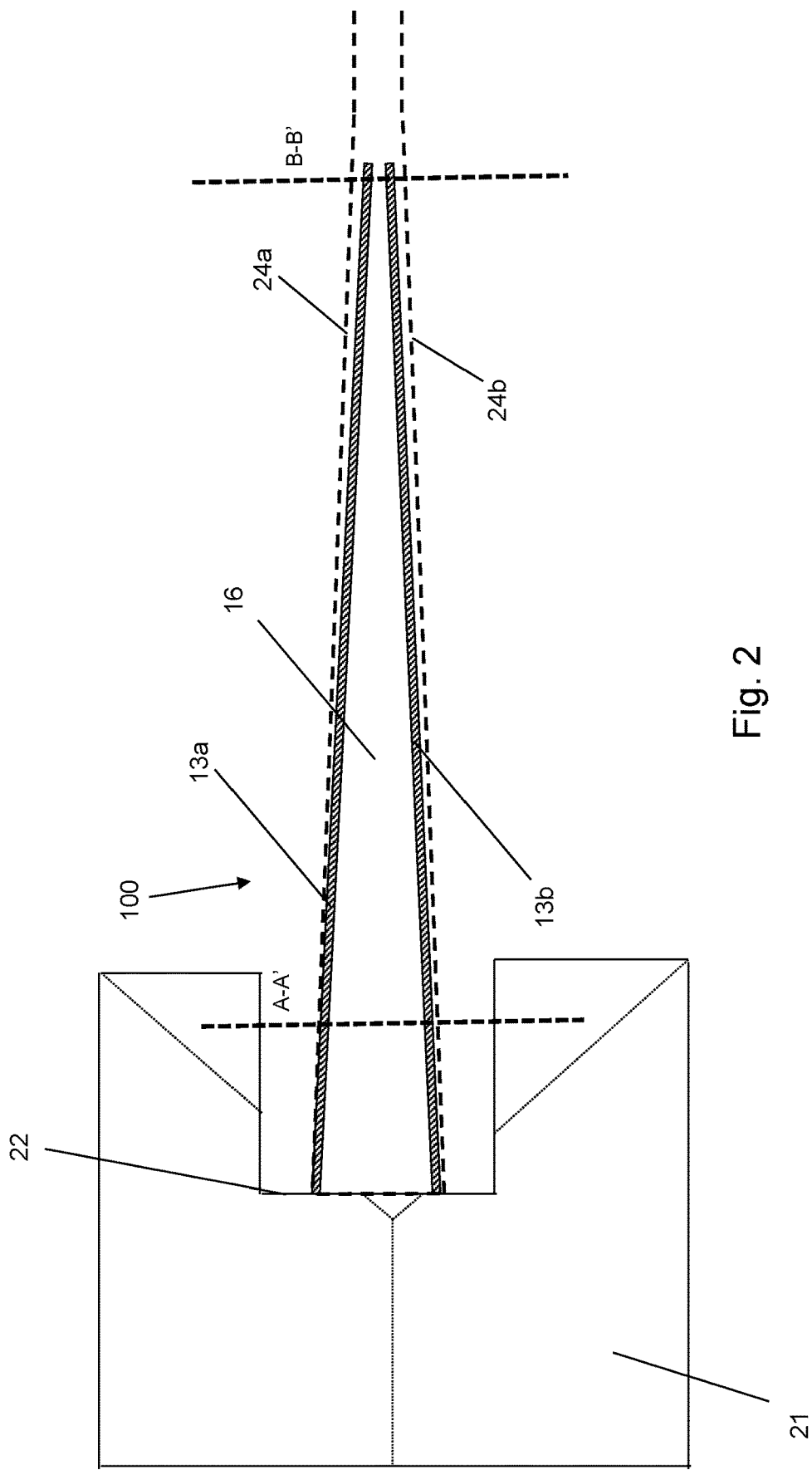
FIG. 2 shows the mode converter of FIGS. 1A and 1B in a top-down plan view.

FIG. 2 is a top-down plan view of the mode converter 100 shown in FIGS. 1A and 1B. Here it can be seen that the rib waveguide 16 (and tapered waveguide 102) extend to an input facet 22 of the mode converter, which overhangs the V-groove 21. The input facet may include an anti-reflective coating, which can further reduce loss. It is also easier to see in this Figure that the sidewalls 24a, 24b (which define the rib waveguide) are angled relative to one another so as to provide a rib waveguide which tapers in length. FIG. 2 is not to scale; the taper angles are greatly exaggerated so as to be perceptible in the drawing. The overall length of the mode converter 100 is typically within the range of 6-10 mm for a linear taper (i.e. constant taper angle) or shorter through the use of a non-linear taper design (as such, the taper angles may be of order 1 mrad). Two cross-sections are indicated: A-A' and B-B' which are respectively shown in FIGS. 3A and 3B.

Figure 3A:
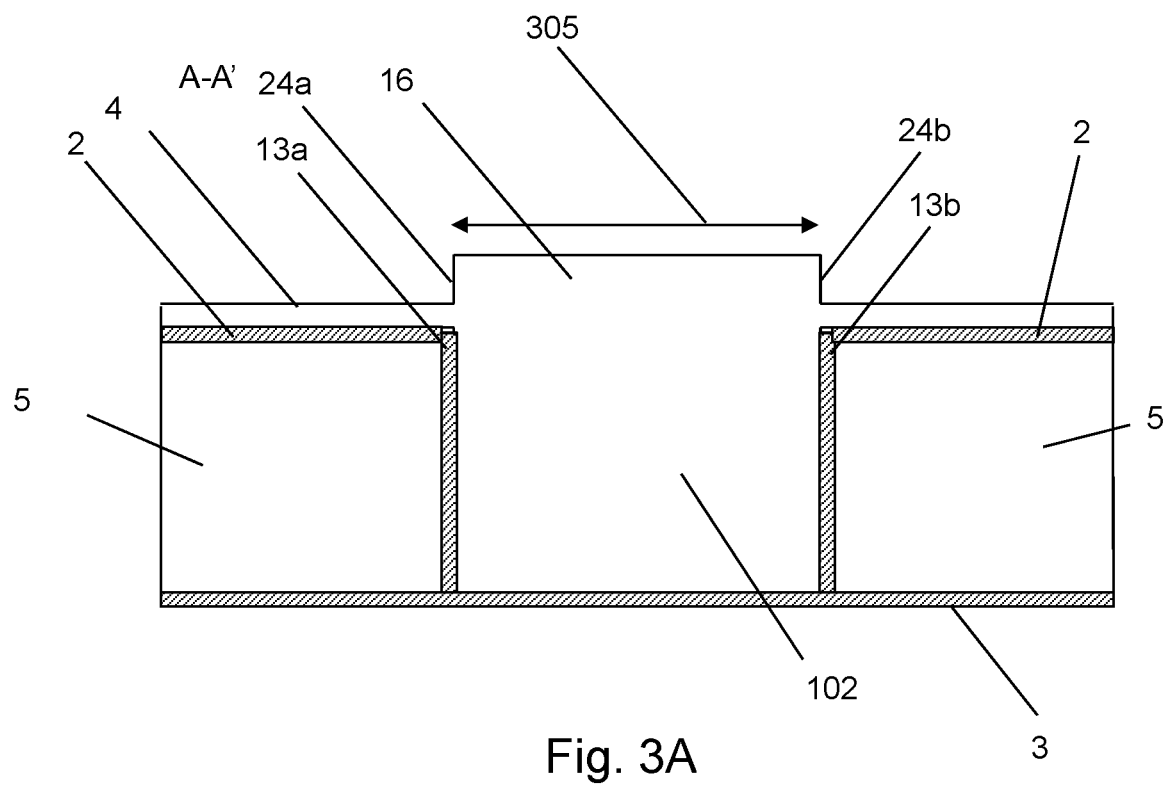
FIGS. 3A and 3B show cross-sections of the mode converter.

FIG. 3A shows the cross-section along A-A'. The mode converter generally comprises a first buried oxide layer 3, above which is a mode converter layer 5. The mode converter layer 5 is at least partially capped by a second buried oxide layer 2. The tapered waveguide 102 is defined at least in part by cladding layers 13a and 13b, which serve to optically isolate the tapered waveguide 102 from the remaining mode converter layer 5. The isolation trenches may be formed from, for example, silicon dioxide. Above the second buried oxide layer 2 is a device layer 4, at least part of which provides a rib waveguide 16.

Figure 3B:
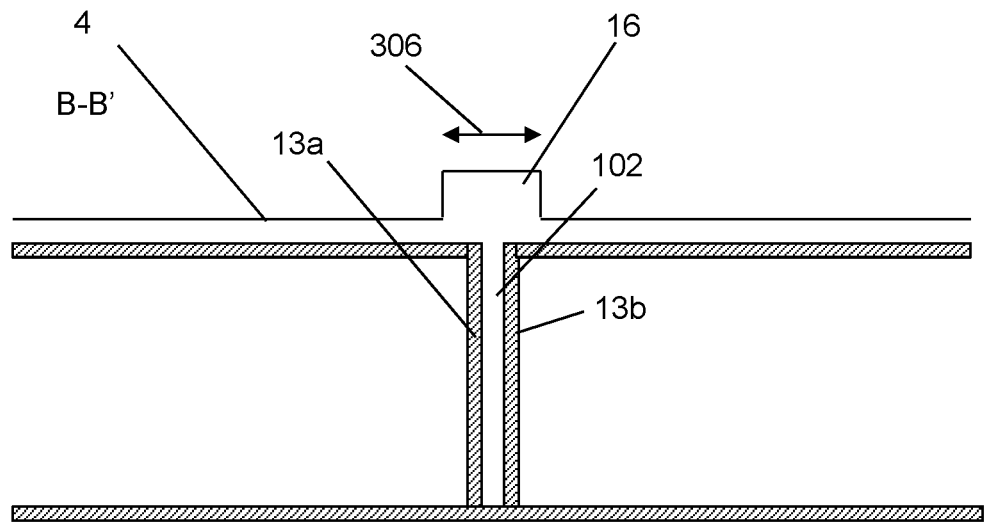

The rib waveguide 16 and tapered waveguide 102, at the location indicated by the cross-section A-A', have a width 305 which partially defines the optical mode. As both waveguides taper in width, at the location indicated by cross-section B-B', as shown in FIG. 3B, they have a width 306 which is narrower than width 305. The width at the input facet 22 may be between 9 μm-15 μm, whereas the width at the end of the mode converter may be around 1 μm or less. In some examples the width of the input facet is 13 μm and the width at the end of the mode converter is 0.3 μm. The length over which the tapered waveguide tapers may be around 3.5 mm. The rib waveguide may have a height, as measured from an upper surface of the second buried oxide layer 2, of between 1 μm and 5 μm. The tapered waveguide 102 may have a height, as measured between the first buried oxide layer 3 and second buried oxide layer 2, of between 7 μm and 12 μm.

Figure 4:
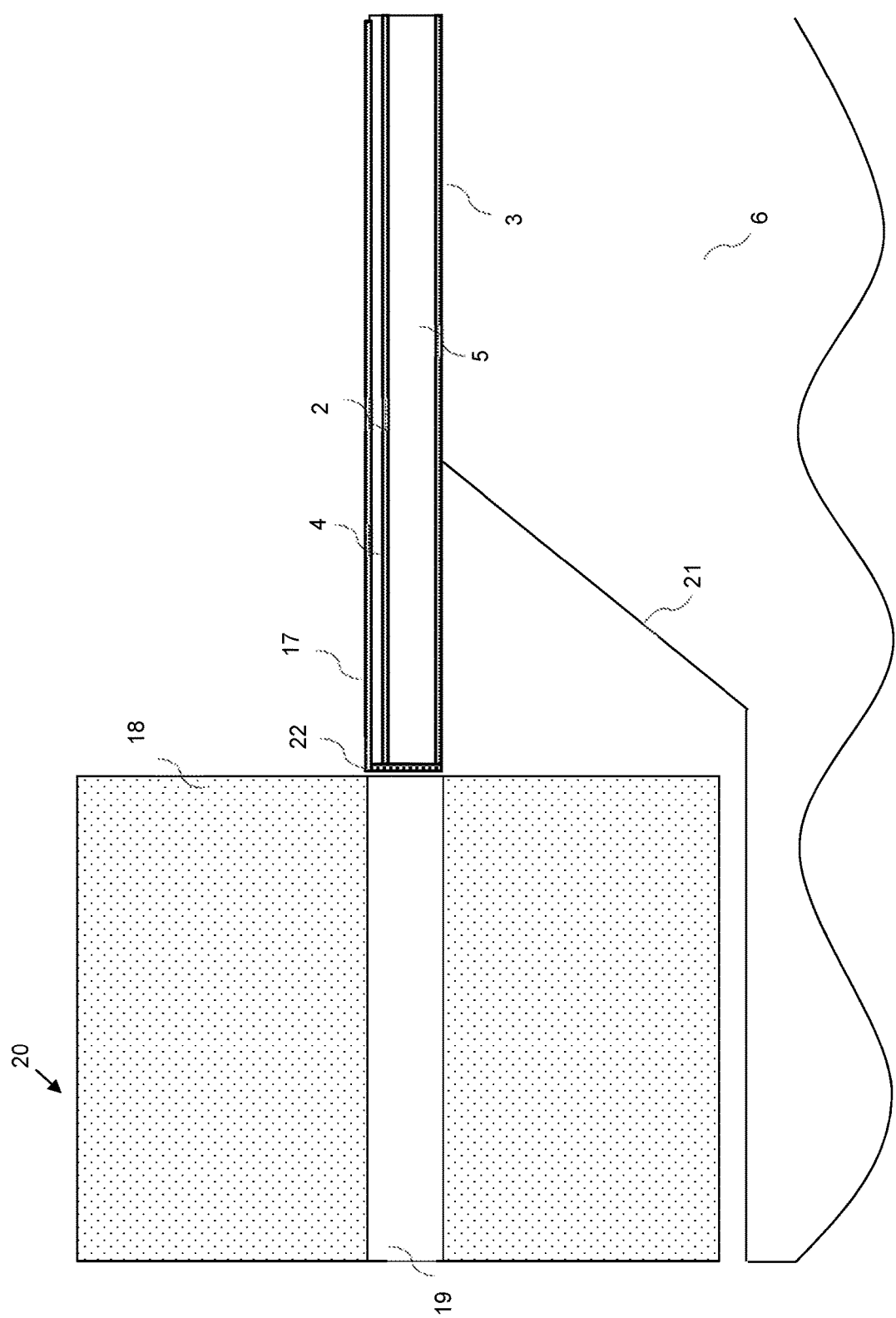
FIG. 4 shows a cross-section of the mode converter as connected to a fiber optic cable.

FIG. 4 shows the mode converter 100 as connected to a fiber optic cable or "optical fiber" 20. The fiber optic cable 20 sits within the V-groove, with its outer cladding 18 abutting the floor of the V-groove. The inner core 19 of the fiber optic cable is thereby aligned with the input facet 22 of the mode converter, such that light can pass from the inner core into the tapered waveguide 102 and rib waveguide 16 with relatively little loss. This form of alignment is known as passive alignment, as the structure of the devices allows mechanical alignment of the inner core 19 and input facet 22.

Figure 5:
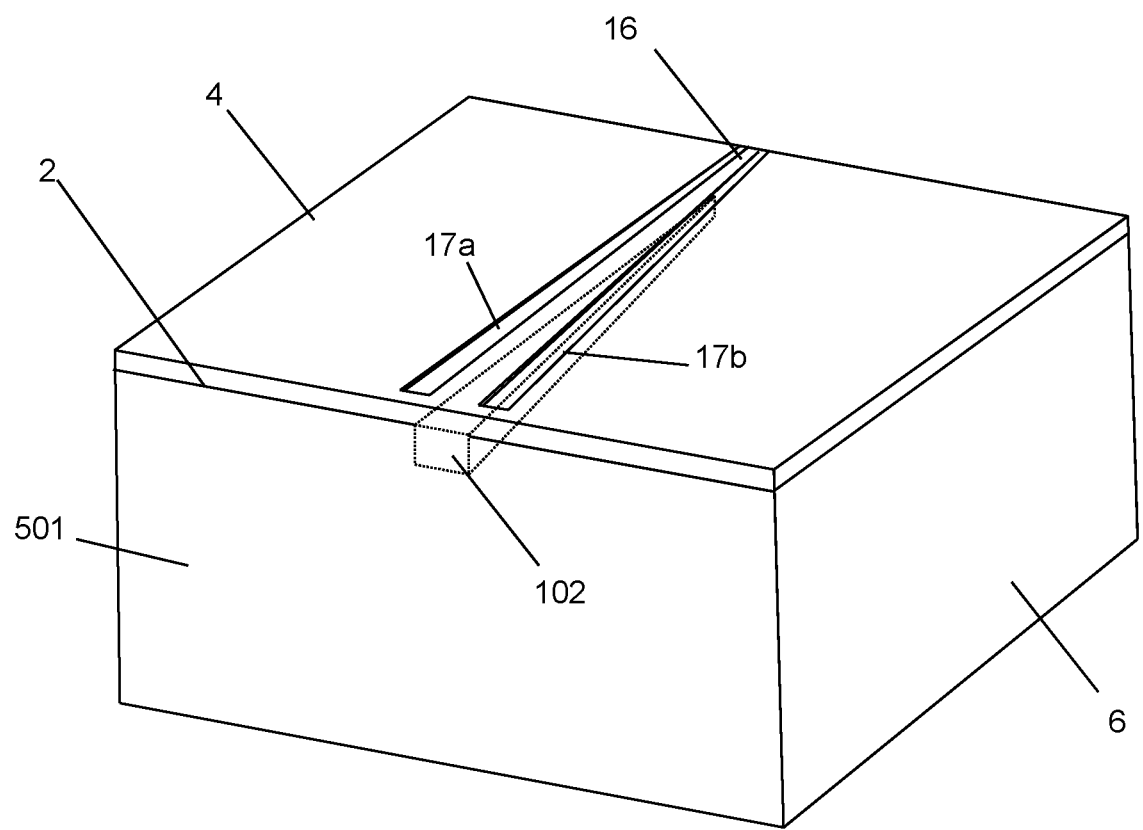
FIG. 5 shows a variant mode converter.

In contrast, FIG. 5 shows a variant mode converter which utilizes active alignment. Active alignment is the process of providing an optical signal into the mode converter from a fiber optical cable, measuring the loss in the optical signal as a function of position, and calibrating the position of the fiber relative to the mode converter so as to minimize the loss in the optical signal.

Therefore, as shown in FIG. 5, a generally planar surface 501 is provided so as to allow maximum flexibility in active alignment. The tapered waveguide 102 can be displaced both horizontally and vertically relative to a connecting fiber optic cable.

Figure 6A:
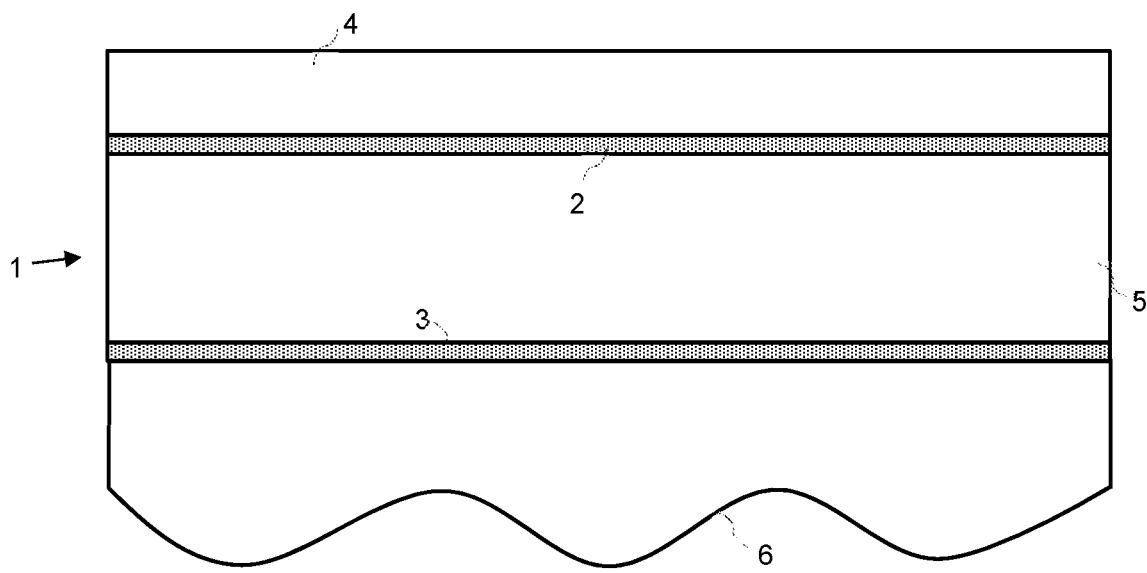
FIGS. 6A-6N show various manufacturing stages of the mode converter of the previous figures.
Figure 6B:
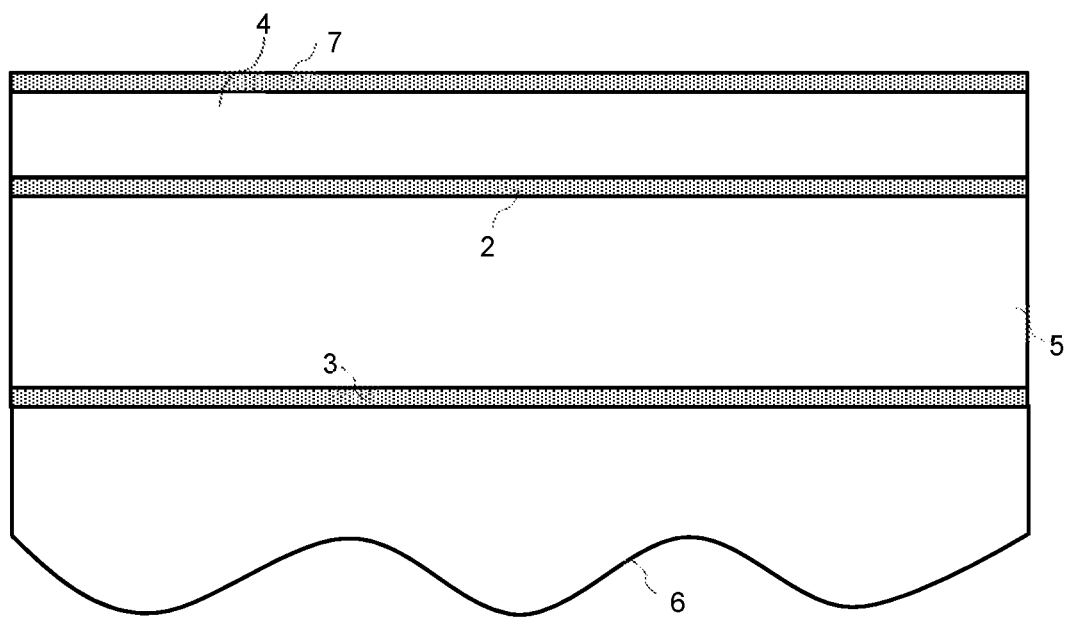
Figure 6C:
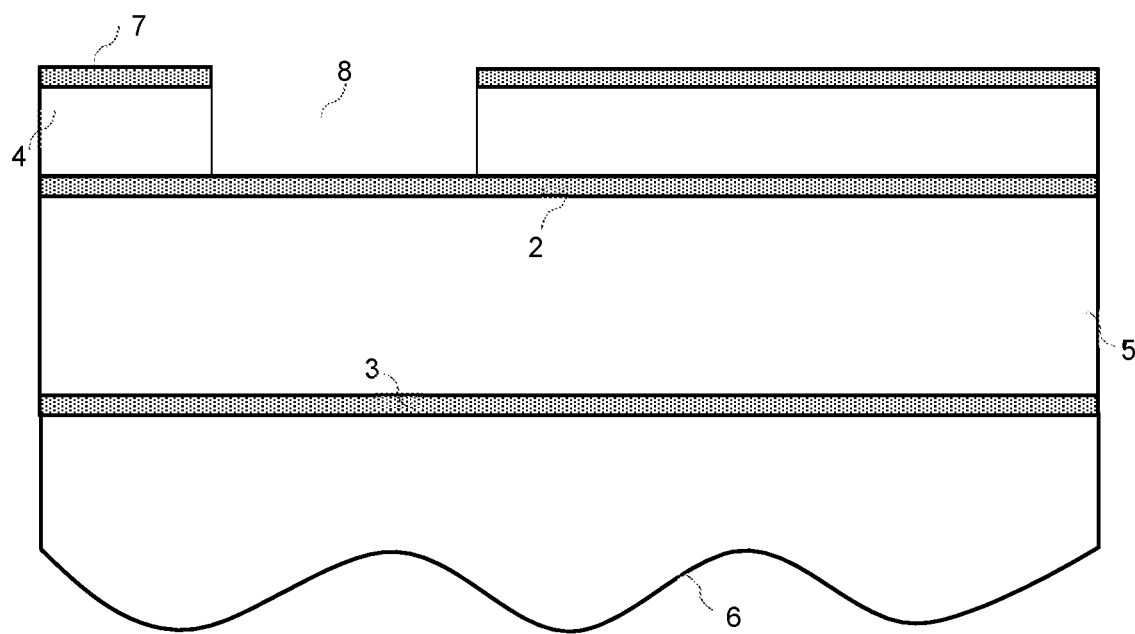
Figure 6D:
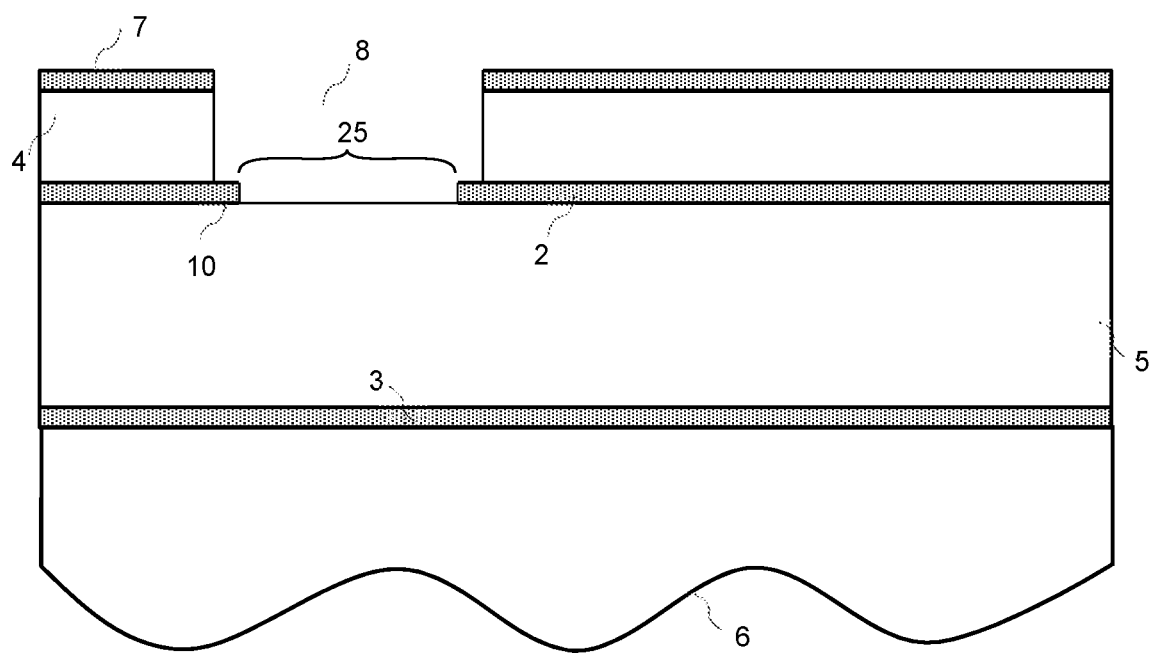
Figure 6E:
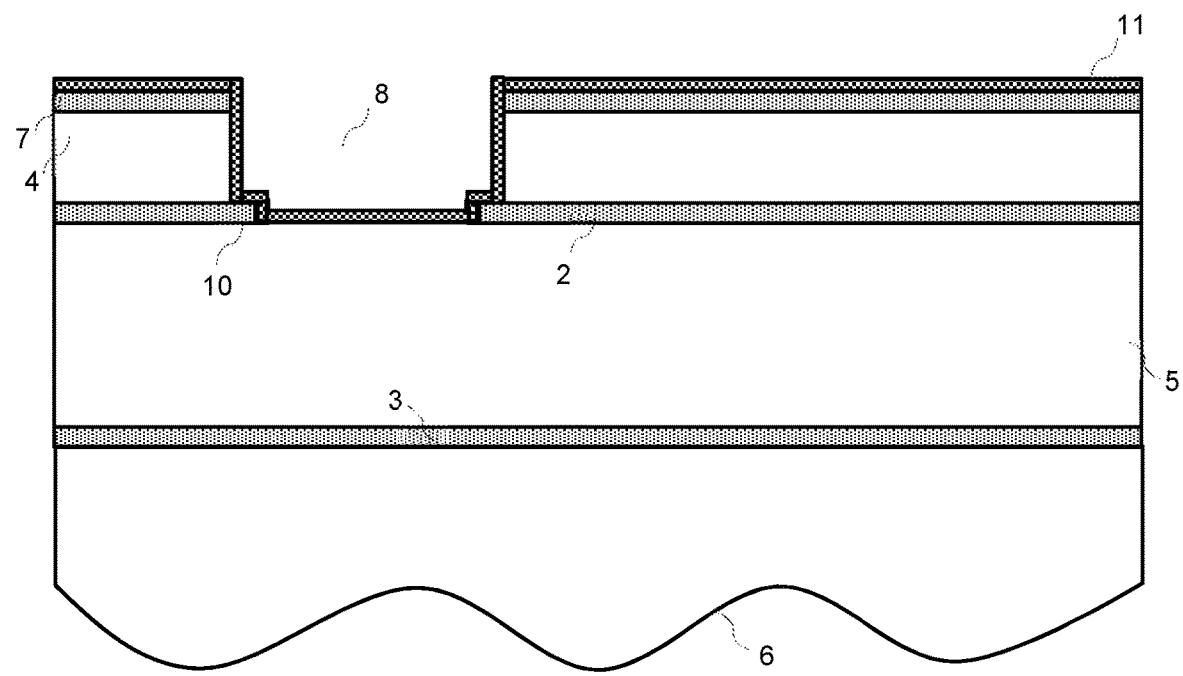
Figure 6F:
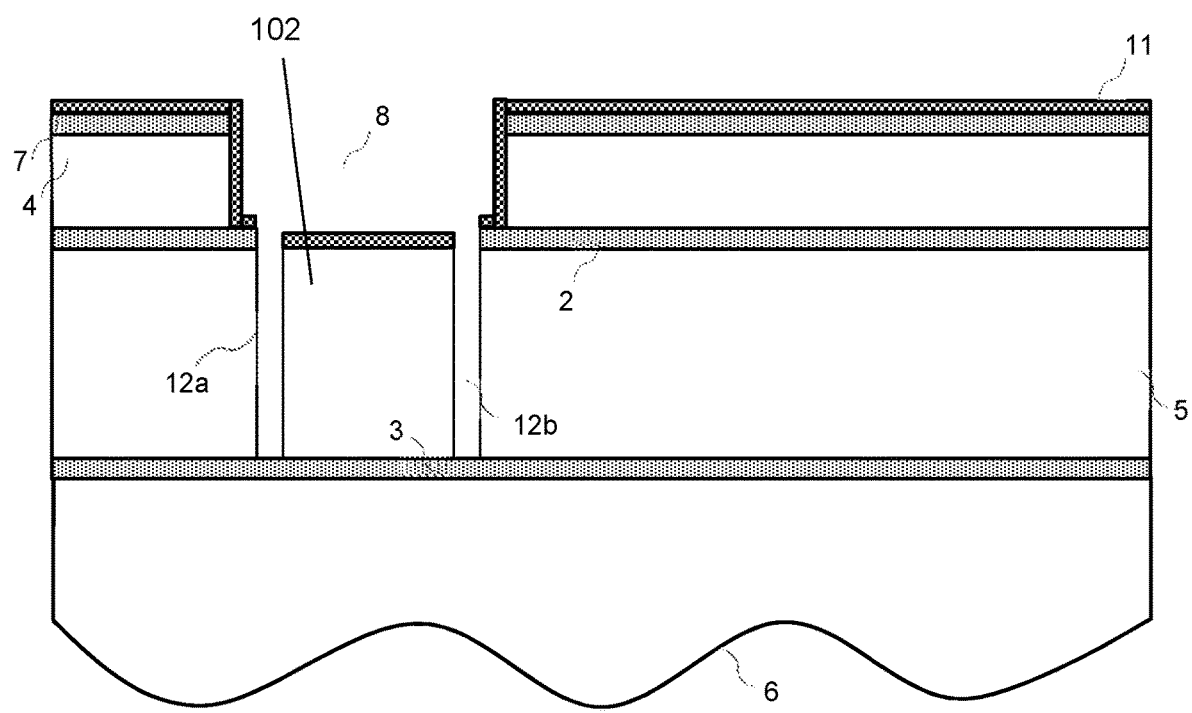
Figure 6G:
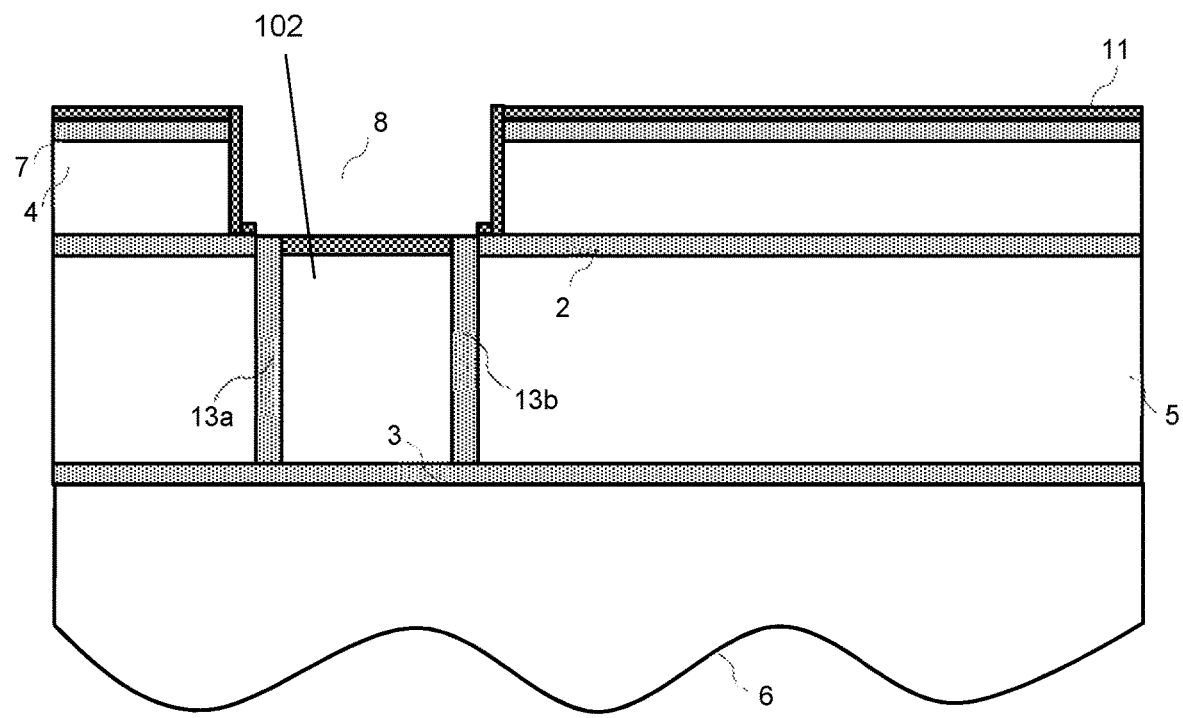
Figure 6H:
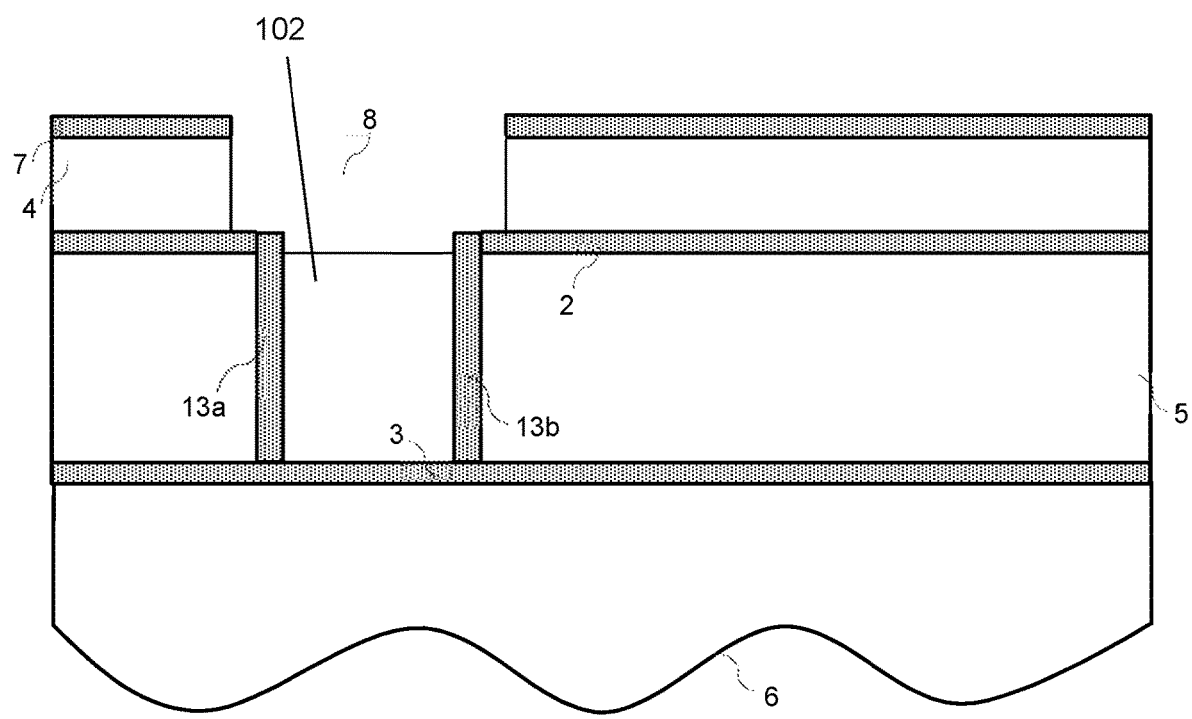
Figure 6I:
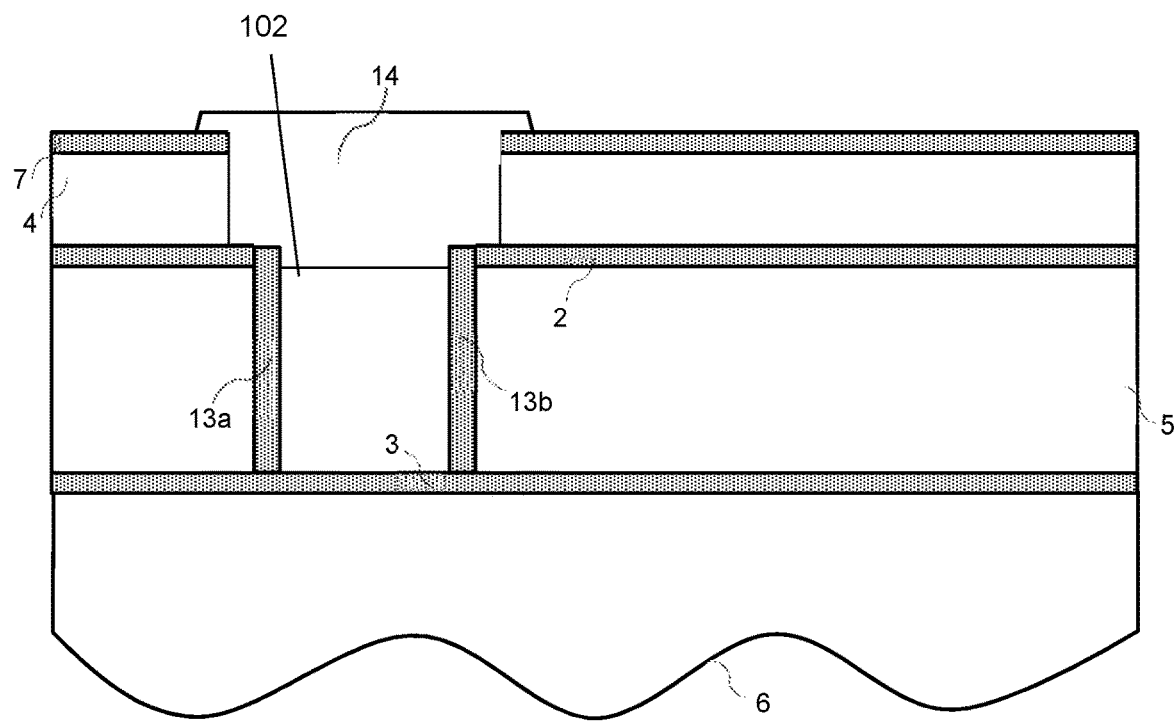
Figure 6J:
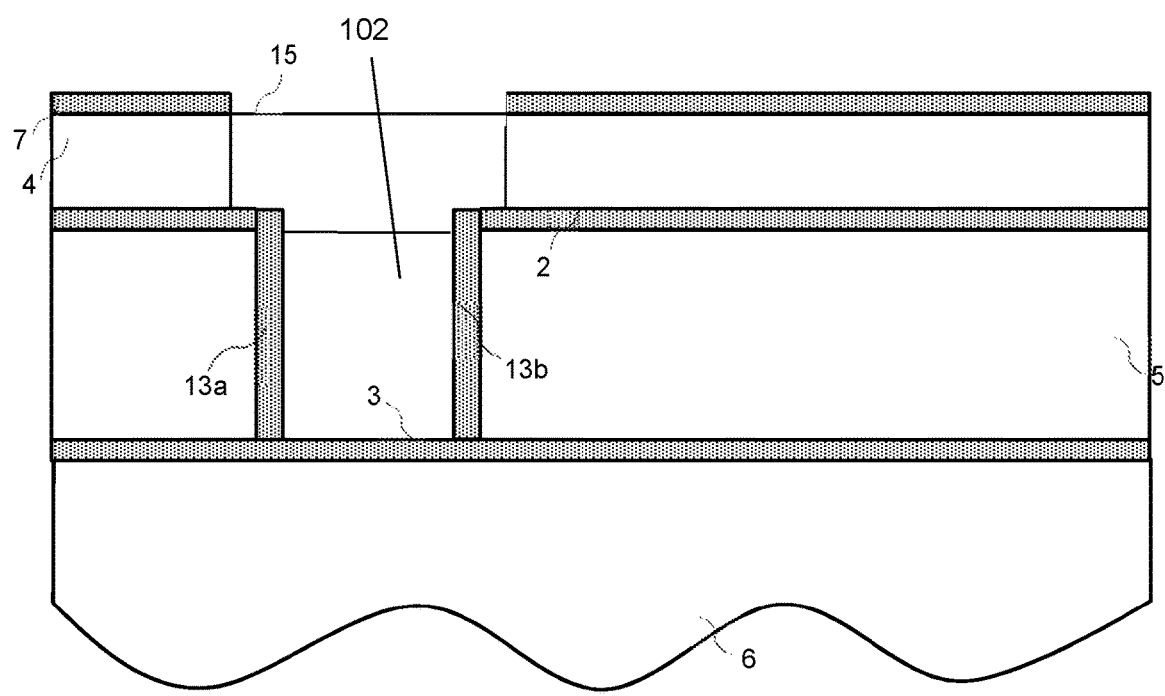
Figure 6K:
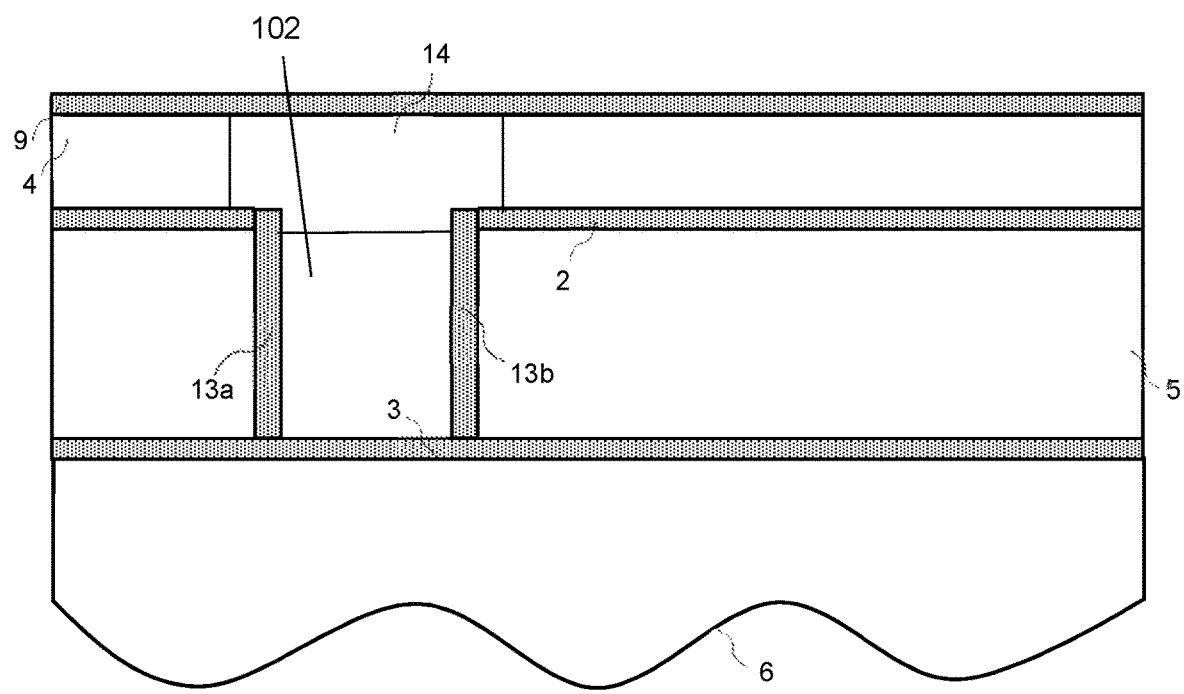
Figure 6L:
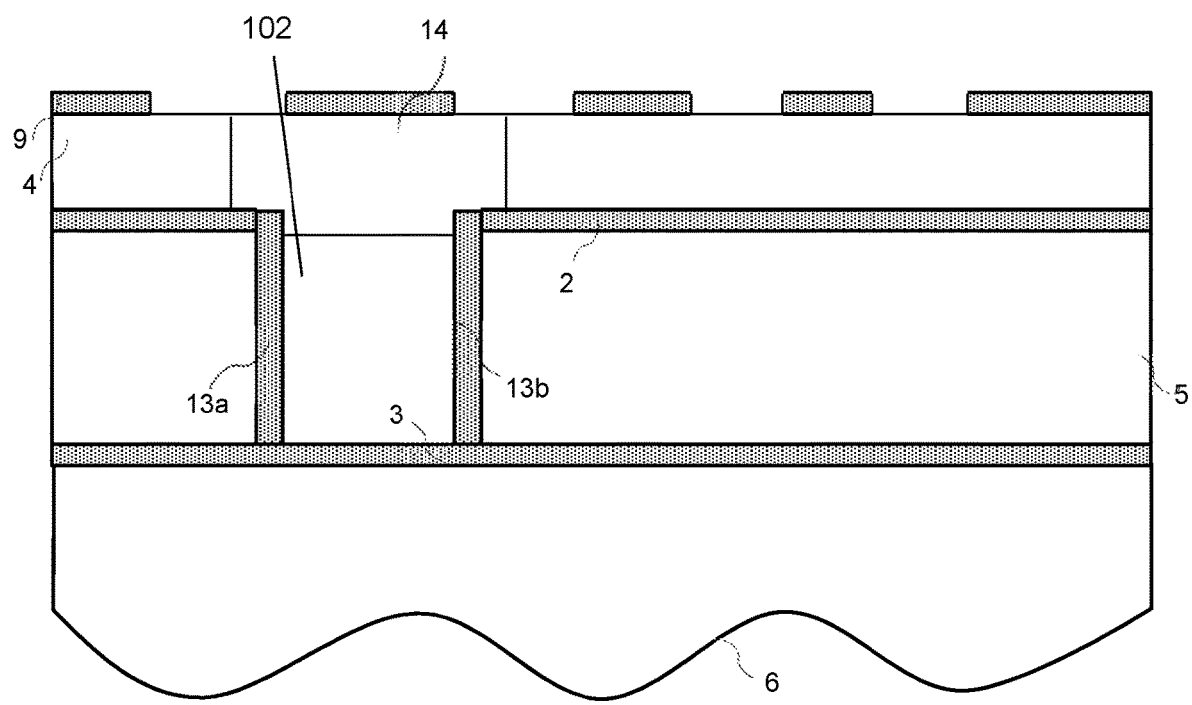
Figure 6N:
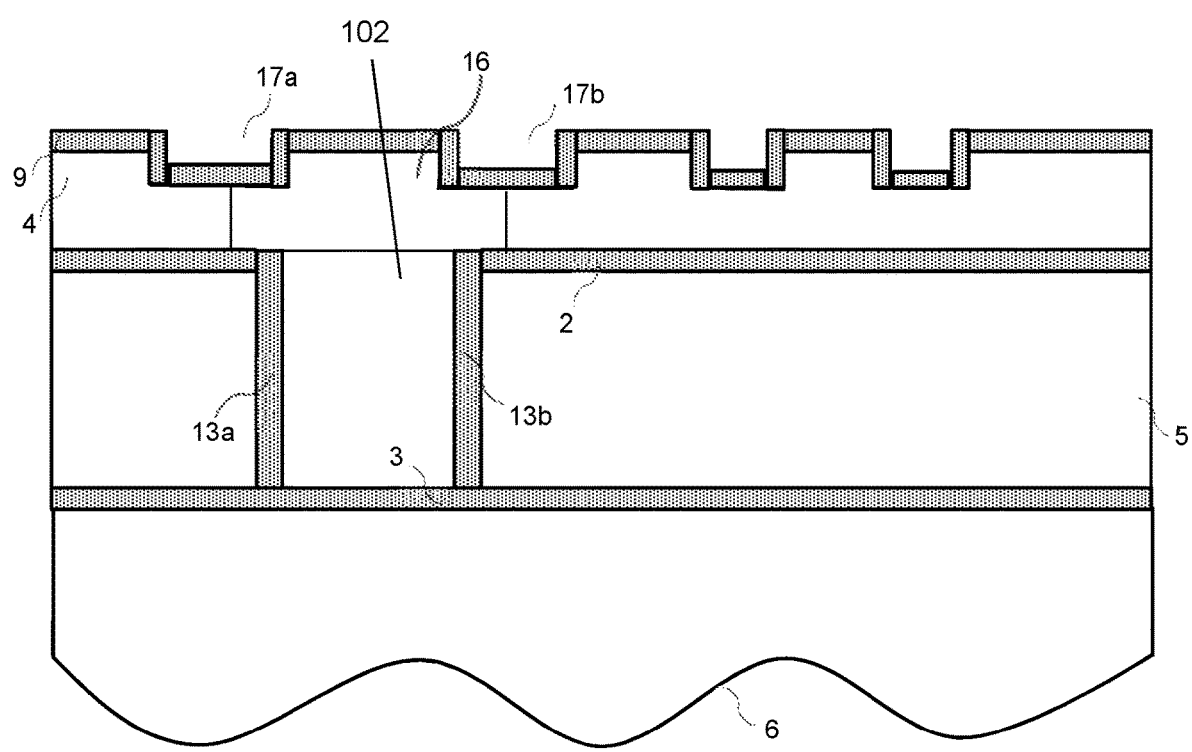

FIGS. 6A-6N show the various manufacturing stages for a mode converter 100 as described above.

In a first step, a wafer 1 is provided which includes a double silicon-on-insulator (DSOI) layer structure, as shown in FIG. 6A. The wafer comprises a substrate 6, for example a silicon handle wafer, above which is a first or lower buried oxide layer 3. Above the first buried oxide layer 3 is a mode converter layer 5, which extends upwards (i.e. away from substrate 6) to meet a second buried oxide layer 2. Above the second buried oxide layer 2 (i.e. on a side opposite to the mode converter layer 5) is a device layer 4. The device layer 4 and mode converter layer 5 may be formed of silicon. The first and second buried oxide layers 2, 3 may be formed of silicon dioxide. The mode converter layer may be between 7 μm and 12 μm, in some examples it is 9.85 μm tall (as measured from the top of the first buried oxide layer 3 to the bottom of the second buried oxide layer 2). The first and second buried oxide layers 2, 3 may be between 0.3 μm and 1 μm thick, in some examples they are 0.4 μm thick. The first and second buried oxide layers 2, 3 should optically isolate the mode converter layer 5 from both the device layer 4 (except where the oxide has been removed) and the substrate 6. The device layer is generally between 1 μm and 5 μm thick, and in some examples is 3 μm thick. The substrate 6 may be either 725 μm or 675 μm thick, depending on the diameter of the wafer (either 200 mm or 150 mm).

In a next step, shown in FIG. 6B, a hard mask layer 7 is disposed over the device layer 4. The hard mask layer may be a thermally grown silicon dioxide layer grown from a silicon device layer 4. The hard mask is a sacrificial layer that may be removed later in the processing steps. It functions as an effective etch mask and protection layer for device layer 4. Accordingly it should be sufficiently thick, for example 300 nm as measured from the top of the device layer to the top of the hard mask 7.

In FIG. 6C, the hard mask 7 has been patterned using photolithography and then etched down along with a portion of the device layer 4 to remove the silicon in areas of the wafer surface where the tapered waveguide will be fabricated. A cavity 8 results in the device layer. A dry etch technique may be used to maintain good dimensional control of the etched features.

A further processing step is shown in FIG. 6D. The upper or second buried oxide layer 2 is patterned and etched within the cavity 8, forming an opening 25 (e.g., a tapered opening) in the second buried oxide layer 2, which enables light to couple, in the completed mode converter, from the mode converter layer to the device layer. The width 10 of the buried oxide region within the cavity is optimized to improve lithography in the bottom of the cavity 8, and to provide optical isolation of the rib waveguide portion in the device layer 4. Next, as shown in FIG. 6E, an oxidation barrier 11 is deposited over the device. The oxidation barrier may be deposited using a low pressure chemical vapor deposition (LPCVD) technique with a barrier thickness of below 200 nm so as to prevent excessive stress on the substrate.

In FIG. 6F, the oxidation barrier 11 and upper or second buried oxide layer 2 are patterned using photolithography. The mode converter layer 5 is then etched to an upper surface of the first buried oxide layer 3, thereby forming narrow trenches 12a and 12b which optically isolate the tapered waveguide 102. The trenches 12a and 12b are angled relative to each other along their length (in a direction into the plane of FIG. 6F) such that the distance between them varies with length. The narrow end of the tapered waveguide is generally designed so as to have a width of less than 0.5 μm (as measured between the trenches 12a and 12b), as this helps to provide low loss coupling the rib waveguide 16 in the device layer 4. The width of the isolation trenches 12a and 12b (as measured in a direction horizontally across the substrate 6) may be minimized (and is typically within the range 0.4 μm-1.0 μm) whilst still providing the necessary optical isolation.

FIG. 6G shows a subsequent step, where the isolation trenches 12a and 12b have been filled to become a first cladding layer 13a and a second cladding layer 13b of the tapered waveguide. This may be achieved by thermally oxidizing the substrate 6, such that the first and second cladding layers 13a, 13b are formed of silicon dioxide. The oxidation barrier 11 prevents any oxidation of the surface, and so the thickness of the device layer 4 is not affected by this step. Advantageously, this means that the tightly controlled uniformity of this later is preserved. The oxidation barrier 11 is then removed, for example by using a wet chemical etchant such as phosphoric acid (because this does not etch the underlying silicon dioxide 7 or silicon 4) resulting in a device as shown in FIG. 6H.

Next, the device layer 4 is regrown in the cavity 8 as shown in FIG. 6I. When the device layer 4 is made of silicon, a selective silicon epitaxial process is used. Such a process only grows silicon on silicon surfaces, and so there is no growth on the oxide layer 7. The regrowth process results in an overgrown region 14 above the oxide layer 7. Therefore, as shown in FIG. 6J, the regrown region 14 is planarized to provide a regrown region 15 which matches the original surface height of the device layer 4. The planarization may be performed by a chemical mechanical polishing process.

In a subsequent step, as shown in FIG. 6K, the previous hard mask 7 is removed (for example using a wet chemical etchant such as hydrofluoric acid) and a new hard mask 9 is provided. The new hard mask may be thermally grown (and so would be an oxide mask) or may be deposited. The uppermost surface of the device is now generally planar, and so it will be appreciated that photonics elements of the integrated photonic circuit subsequently fabricated in the device layer 4 are not compromised by the presence of the mode converter 100 (in contrast to the prior art approaches).

FIG. 6L shows a next fabrication step, where the hard mask 9 is patterned using photolithography and then etched, e.g., using a dry etch process to maintain good dimension tolerances. After this step the device layer 4 is etched to fabricate a rib waveguide 16 which is aligned to the tapered waveguide 102 in the mode converter layer 5. The rib waveguide 16 is generally defined by the production of two channels 17a and 17b as discussed above. The result is shown in FIG. 6M(i).

It will be appreciated by those skilled in the art of silicon photonic circuits that a wide variety of photonic elements can now be fabricated in the device layer connected via the rib waveguide 16 to the tapered waveguide 102 for low loss coupling from a photonic integrated circuit to a fiber optic cable (and vice versa).

An alternative example is shown in FIG. 6M(ii), where the cavity 8 etched in FIG. 6C is made significantly wider than the tapered waveguide 102 width. The width 10 of the oxide isolation region is typically a few microns wide so as to ensure that the rib waveguide 16 is optically isolated from the mode converter layer 5. Advantageously, the photoresist is more uniform at the bottom of the cavity 8 in the region of the tapered waveguide. This allows better dimensional control. Also, the wide cavity is not tapered but remains a constant width, which can be beneficial during the planarization process. For example, it has been found that during chemical mechanical polishing the polishing rate varies with cavity width.

FIG. 6N shows a final processing step for the mode converter 100 where a cladding layer is grown or deposited on top of the wafer, to act as a hard mask for downstream processing steps and to provide passivation and protection for the photonic integrated circuit. It will be appreciated to those skilled in the art, that a wide range of passive photonic elements including (but not limited to) multiplexors, demultiplexors, and other wavelength selective devices may be fabricated in the device layer. Likewise, the addition of further downstream process modules such as doping, contacts, and metallisation allows the realisation of active photonic devices such as switches, p-i-n diodes, and modulators.

Figure 7B:
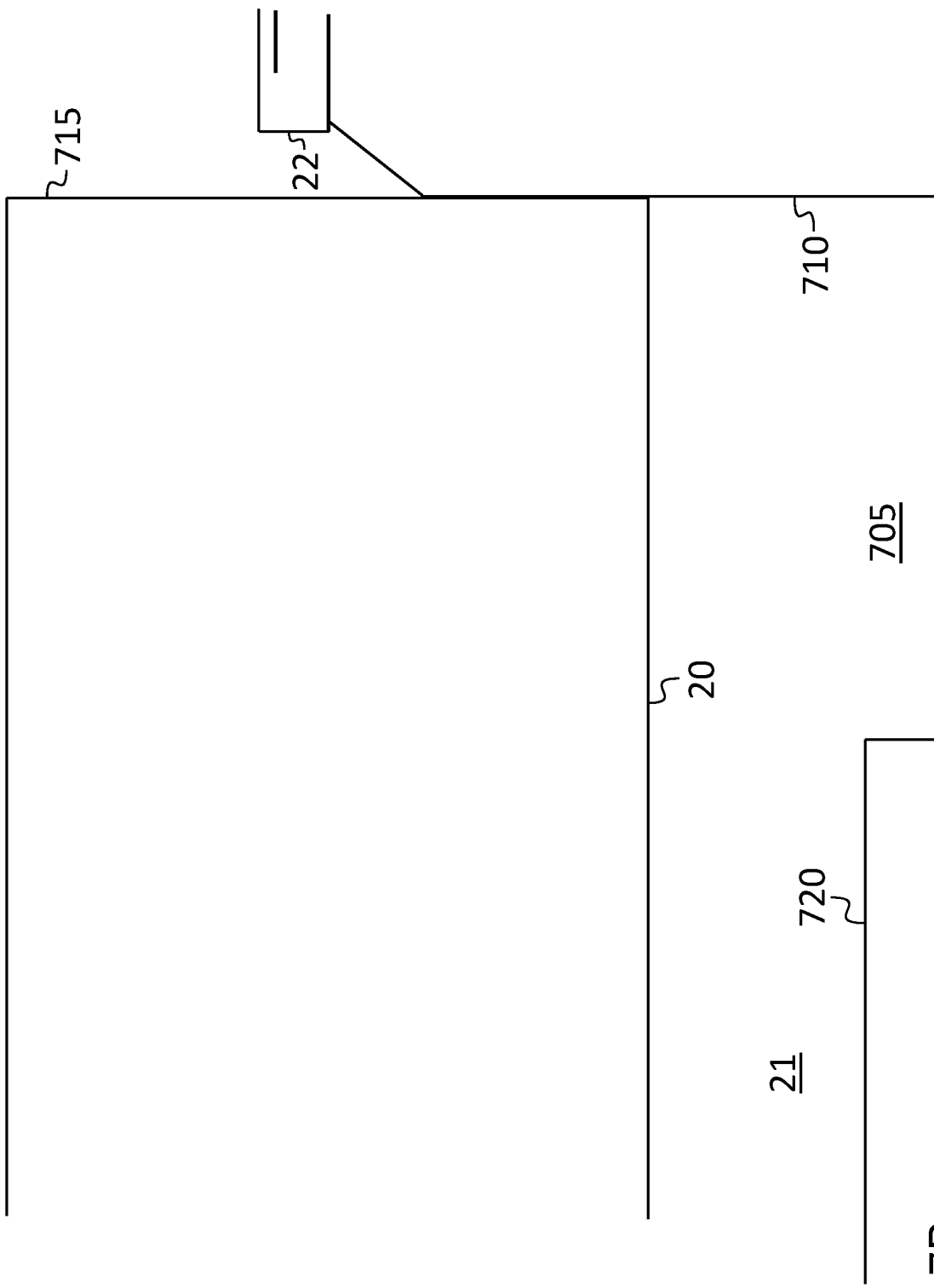
FIG. 7B shows a schematic side view of an optical fiber adapter.

FIG. 7A shows an optical fiber adapter, including a mode converter and alignment features for an optical fiber, in some embodiments a saw cut 705 is made perpendicular to the V-groove 21, forming a trench having an end wall 710 against which the end of the fiber optic cable 20 may abut, thereby setting the separation between the fiber end facet 715 (FIG. 7B) and the input facet 22. The saw cut 705 may be made to a depth of about 125 microns below the top surface of the device layer 4 (e.g., it may extend past the bottom 720 of the V-groove 21, as shown), and it may have a width of about 100 microns. The bottom of the saw cut 705 is shown as having square edges for ease of illustration; in some embodiments the edges are rounded, e.g., with a radius of about 10 microns. The V-groove 21 may be made to a width such that when the fiber is placed into the V-groove 21 the mode center 730 of the fiber optic cable 20 coincides sufficiently well with the mode center 725 of the tapered waveguide 102 and the rib waveguide 16 to avoid unacceptable coupling loss. The V-groove 21 may have a flat (horizontal) portion at the bottom (not shown in, e.g., FIGS. 7D, 7E, and 7H); the depth of the V-groove 21 to this flat portion, if present, may be sufficiently great that when the optical fiber 20 is placed in the V-groove 21 it only touches the angled sidewalls 722 (FIG. 7H) of the V-groove 21 and not the flat bottom of the V-groove 21. As used herein, the "mode center" is the centroid of the irradiance distribution. As used herein, a mode of the tapered waveguide 102 and the rib waveguide 16 is a mode of the "compound waveguide" formed by the tapered waveguide 102 and the rib waveguide 16.

FIG. 7B shows a fiber optic cable 20 in the V-groove 21, with the cleaved fiber end facet 715 abutting against the end wall 710. FIG. 7C shows an embodiment in which the fiber end is cleaved at an angle. In the embodiment of FIG. 7C, the back reflection from the fiber end facet 715 (for light propagating inside the optical fiber 20) may be lower (than in the embodiment of FIG. 7B). The back reflection may be less than −15 dB (e.g., it may be between −15 dB and −60 dB) (i.e., the optical return loss for light propagating in the optical fiber 20 toward the fiber end facet 715 may be greater than 15 dB, e.g., between 15 dB and 60 dB). The substantially planar cleaved fiber end facet 715 is angled such that its normal vector is perpendicular to the saw cut 705 (so that in the side view of FIG. 7C, it appears as a line, not as an ellipse). FIG. 7C shows an angle such that the upper part of the fiber is shorter than the lower part. In some embodiments the fiber is rotated 180 degrees relative to the orientation illustrated in FIG. 7C, such that the upper part of the fiber is longer than the lower part. In both FIGS. 7B and 7C, the gap between the fiber end facet 715 and the input facet 22, at the mode centers 725, 730 may be sufficiently small (e.g., between 1.0 microns and 100.0 microns, or less than 30 microns) that power loss resulting from beam divergence is acceptably small. In some embodiments, the insertion loss for light propagating from the optical fiber 20 into the tapered waveguide 102 and the rib waveguide 16 (or for light propagating in the opposite direction) may be between 0.3 dB and 2 dB, e.g., less than 1 dB. The cleave angle for the angle-cleaved fiber end facet 715 may be between 6 degrees and 10 degrees, and may be sufficiently small that power loss resulting from angular misalignment between the mode of the fiber optic cable 20 and the mode of the rib waveguide 16 and the tapered waveguide 102 is acceptably small. In some embodiments the fiber is rotated by 90 degrees relative to the orientation illustrated in FIG. 7C, and (i) the angle of the tapered waveguide 102 and the rib waveguide 16 or (ii) the angle of the input facet 22 (or both angles) are adjusted accordingly.

Figure 7D:
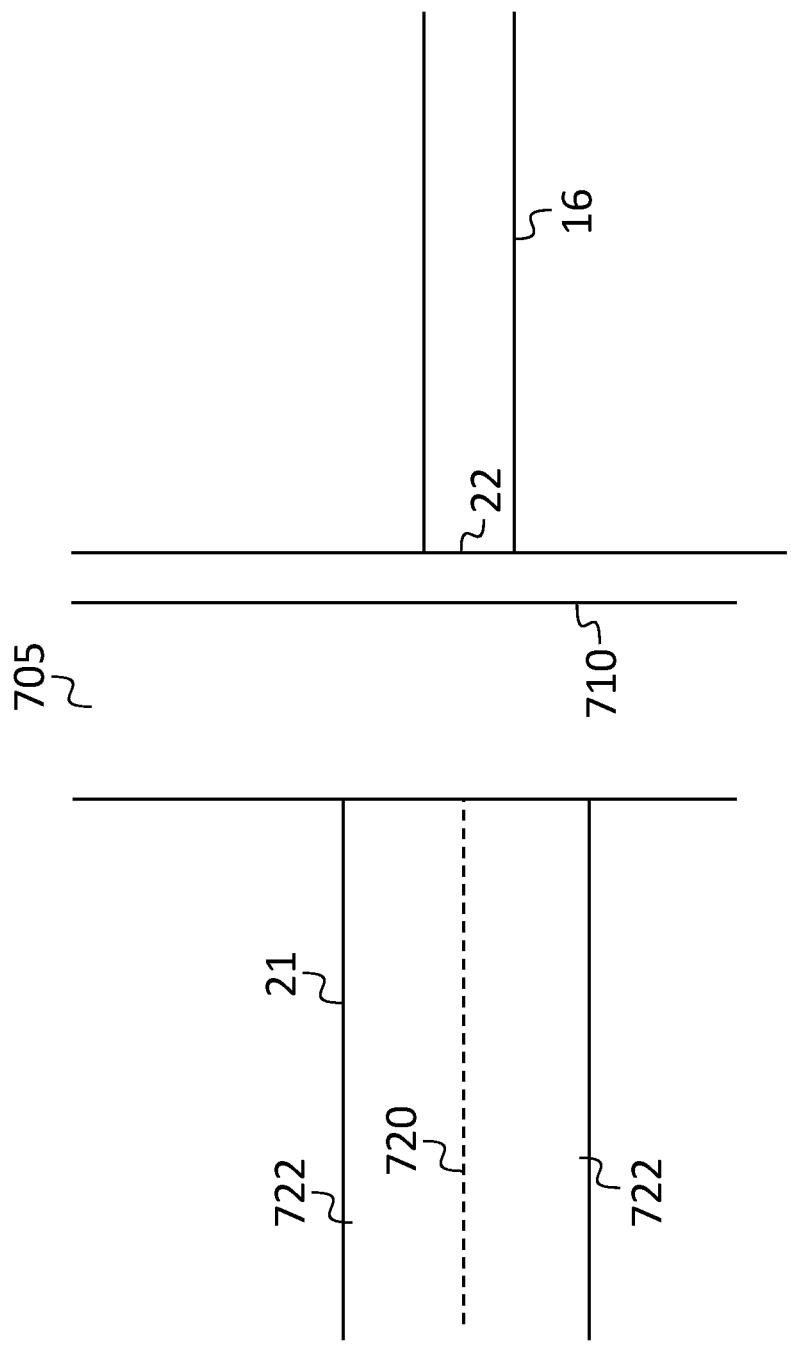
FIG. 7D shows a schematic top view of an optical fiber adapter.
Figure 7E:
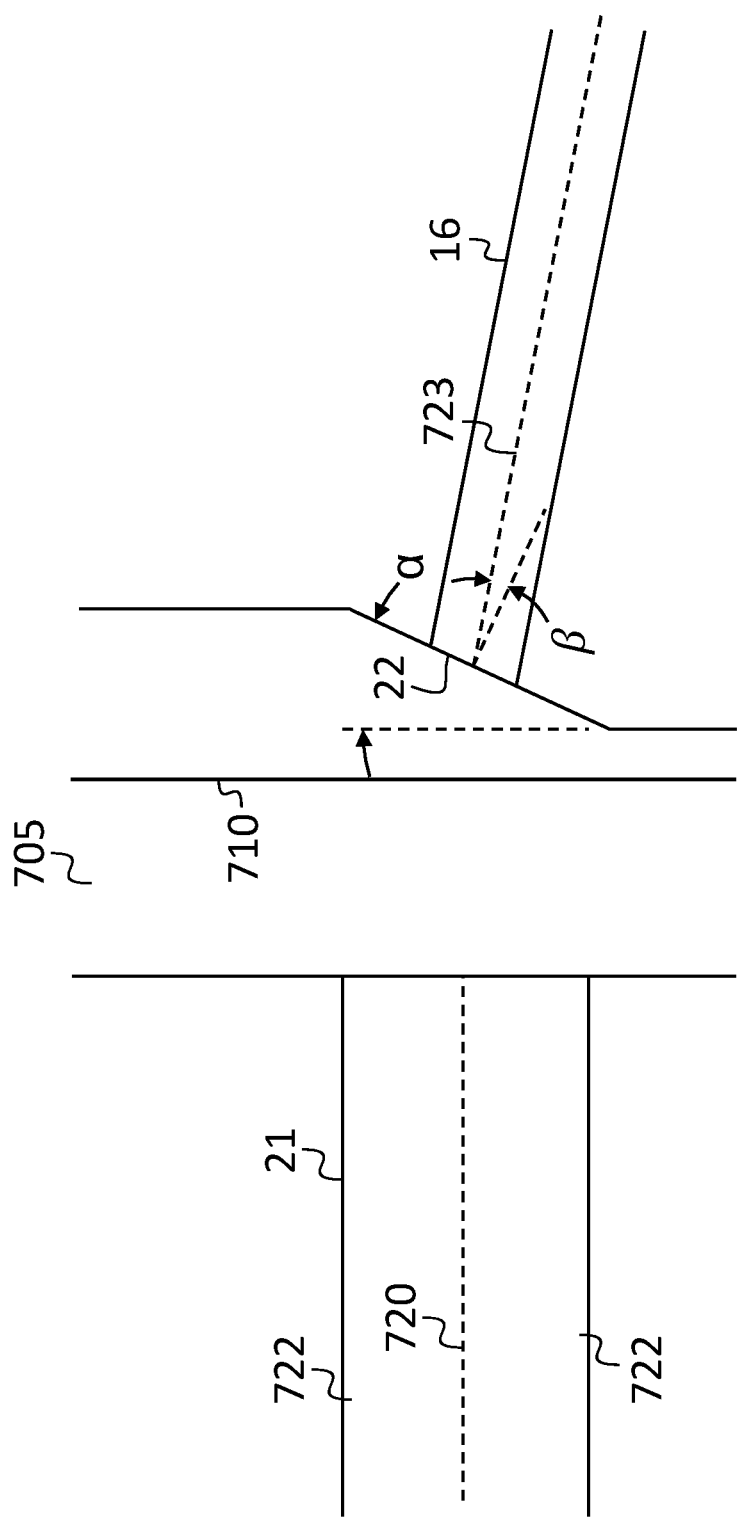
FIG. 7E shows a schematic top view of an optical fiber adapter.

FIG. 7D shows a top view corresponding to FIG. 7A, in some embodiments. FIG. 7D is not drawn to scale, and the tapered waveguide cladding layers 13a, 13b, are not shown, for ease of illustration. In the embodiment of FIG. 7D, the tapered waveguide 102 and the rib waveguide 16 are perpendicular to the saw cut 705, which is perpendicular to the V-groove 21. FIG. 7E shows another top view that may correspond to FIG. 7A, in some embodiments. In the embodiment of FIG. 7E, the input facet 22 angled, as shown, to reduce back-reflections. The facet is angled by an angle $\alpha$ (away from a plane that is perpendicular to the V-groove 21, i.e., relative to the angle of the facet in FIG. 7D), and the tapered waveguide 102 and the rib waveguide 16 (e.g., the centerline 723 of the tapered waveguide 102 and the rib waveguide 16) are angled by an angle $\beta$ (away from a line perpendicular to the input facet 22). As used herein, a "centerline" of a single-mode waveguide is the set of points on which the centroid of the irradiance distribution of an optical mode (e.g., the TE00 mode) falls. The angle $\beta$ may be selected such that refraction upon transmission through the input facet 22 causes the mode of the compound waveguide, outside the input facet 22, to be parallel to the V-groove 21. This may occur when $n \sin(\beta) = n_0 \sin(\alpha)$, where n is the index of refraction of the material of the waveguide (e.g., crystalline silicon) and no is the index of refraction of the material (e.g., a transparent adhesive, which may have an index of refraction of about 1.56) in the gap between the fiber end facet 715 and the input facet 22. The value of $n/n_0$ may be between 2.0 and 2.5. The angle $\alpha$ may be between 2.0 degrees and 15.0 degrees (e.g., it may be 6.0 degrees), and the angle $\beta$ may be between 1.0 degrees and 8.0 degrees (e.g., it may be 2.66 degrees). FIG. 7E is not drawn to scale; for example, the angles $\alpha$ and $\beta$ and are exaggerated so as to be more readily perceptible. The input facet 22 may be coated with an antireflection coating, e.g., a quarter-wave thick coating having an index of refraction intermediate between the index of refraction of the material of the waveguide (e.g., crystalline silicon) and the index of refraction of the material (e.g., the transparent adhesive) in the gap between the fiber end facet 715 and the input facet 22. The return loss for light propagating in the tapered waveguide 102 and the rib waveguide 16 toward the input facet 22 may be greater than 10 dB, e.g., it may be between 10 dB and 50 dB.

Figure 7F:
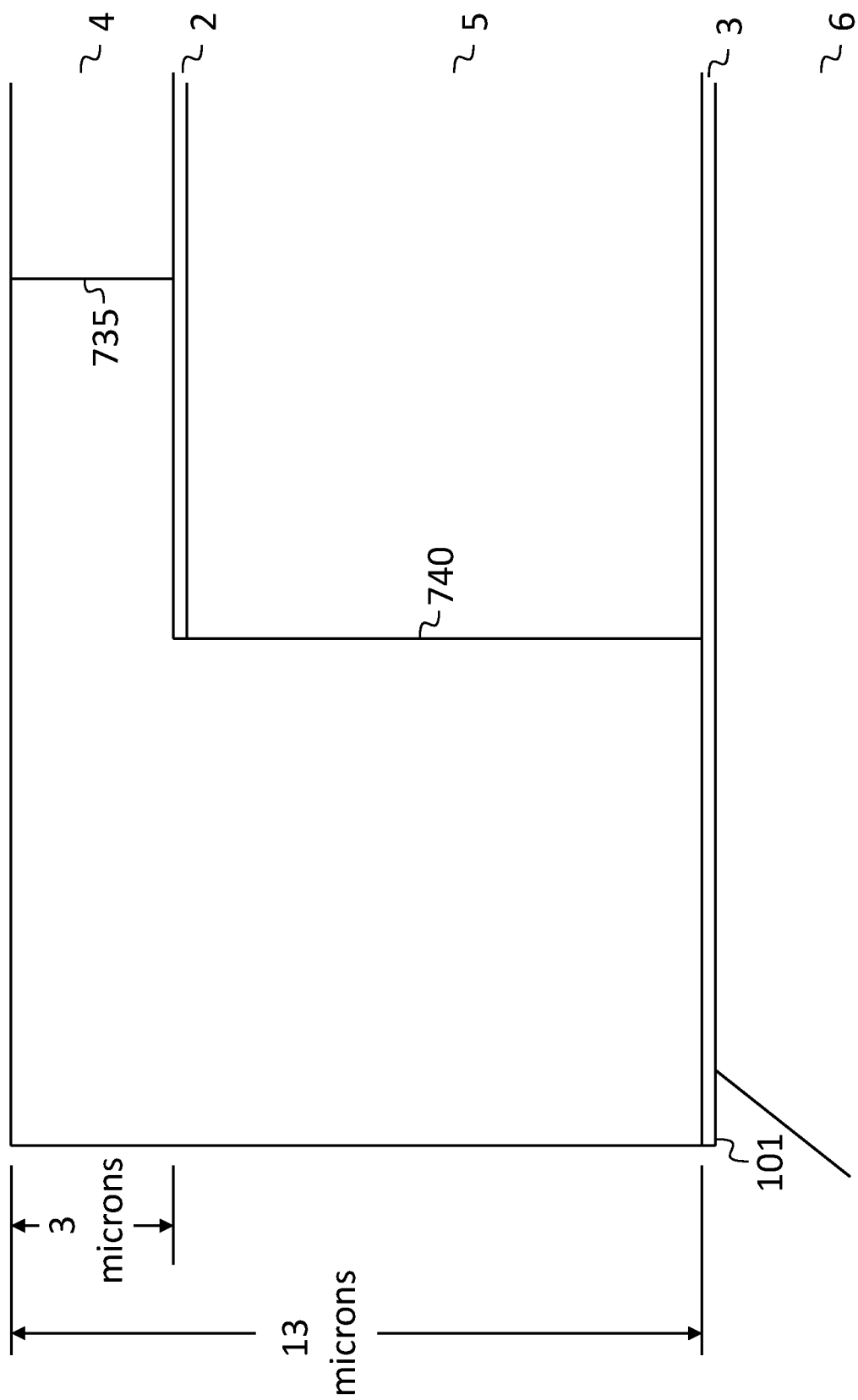
FIG. 7F shows a schematic side view of a portion of an optical fiber adapter.
Figure 7G:
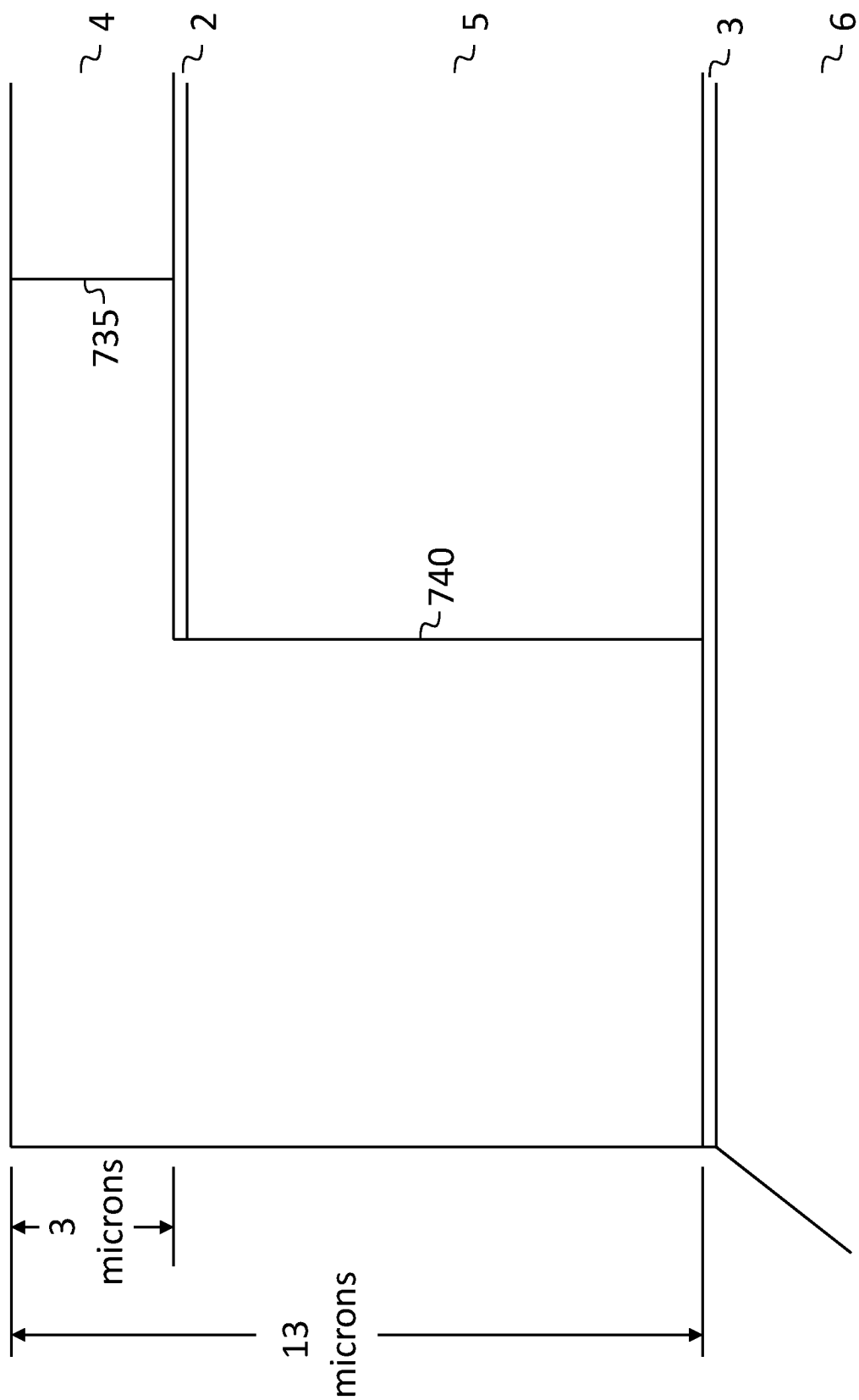
FIG. 7G shows a schematic side view of a portion of an optical fiber adapter.
Figure 7H:
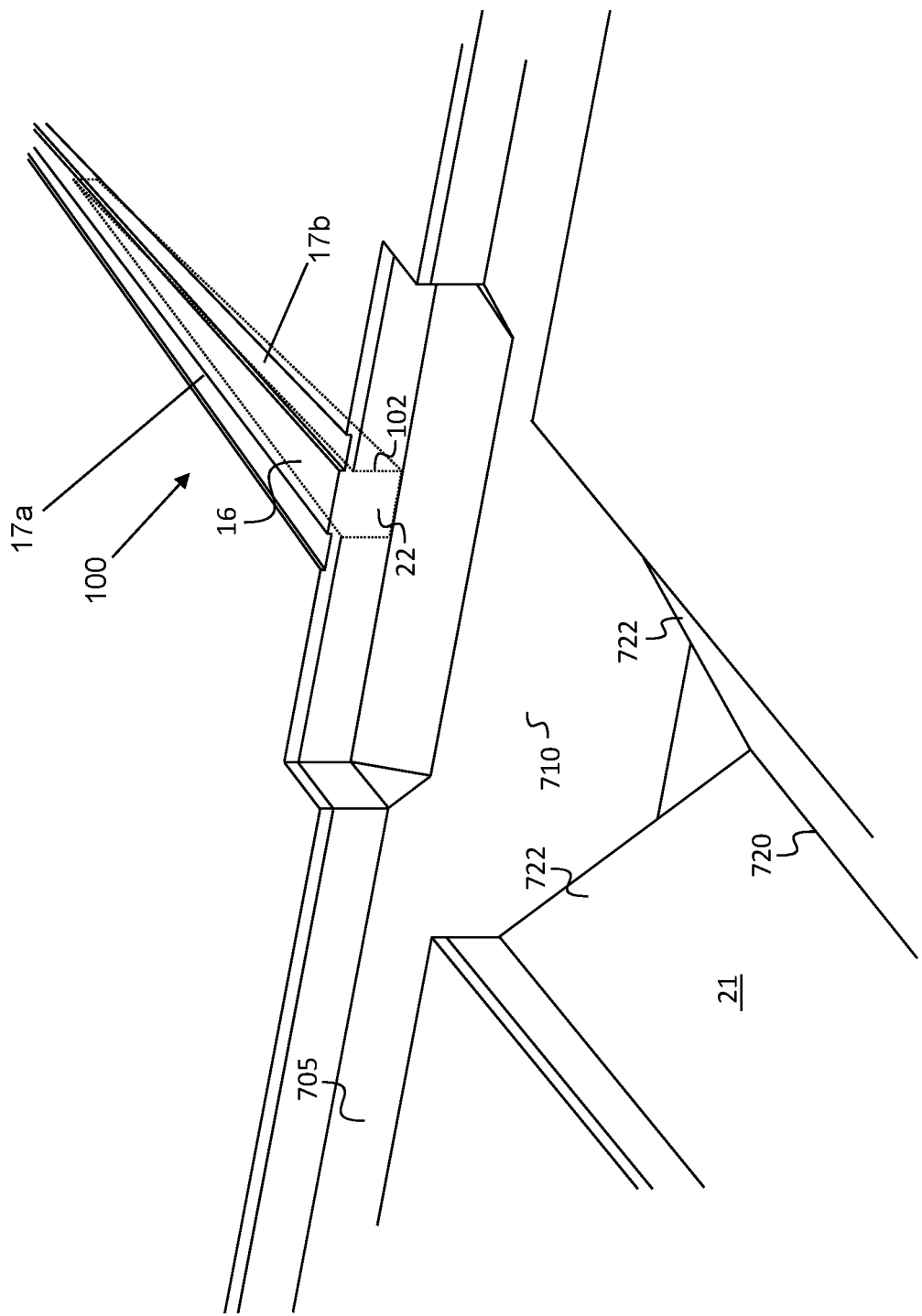
FIG. 7H shows a perspective view of an optical fiber adapter.

FIG. 7F is an enlarged view of a portion of FIG. 7A that includes the end of the tapered waveguide 102 and the rib waveguide 16. As shown in FIG. 7F, the device layer 4 may have a thickness of about 3 microns, and the top of the first buried oxide layer 3 may be at a depth of about 13 microns below the top of the device layer 4, as shown. The overhanging portion 101 may be quite short, or may be absent entirely (as shown in FIG. 7G). The end 735 of the tapered portion of the rib waveguide 16 and narrow end 740 of the tapered waveguide are shown in FIG. 7F (the are not shown in FIG. 7A), although FIG. 7F is not drawn to scale and is greatly foreshortened in the horizontal direction; in some embodiments, the length of the tapered portions of the tapered waveguide 102 and the rib waveguide 16 are of order 1000 times their thickness. FIG. 7H is a perspective view of one embodiment, in which the tapered waveguide 102 and the rib waveguide 16 are perpendicular to the saw cut 705. FIG. 7H is not drawn to scale; for example, the taper angles of the tapered waveguide 102 and the rib waveguide 16 are greatly exaggerated so as to be perceptible in the drawing.

It will be understood that light may travel in either direction in the fiber and in the waveguides, so that, for example, the input facet 22 may be a facet at which light exits the tapered waveguide 102 and the rib waveguide 16. As used herein, the "mode" of a waveguide (e.g., (i) the compound waveguide that includes the tapered waveguide 102 and the rib waveguide 16, or (ii) an optical fiber) is considered to include the free space electromagnetic field pattern that results from light being launched out of an end of the waveguide (e.g., through a facet) (or from which light may couple into the waveguide).

As used herein, when a second number is "within Y %" of a first number, it means that the second number is at least (1−Y/100) times the first number and the second number is at most (1+Y/100) times the first number. As used herein, the "ratio of" a first number to a second number is the first number divided by the second number. Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF FEATURES

1 Wafer
2 Upper buried oxide layer
3 Lower buried oxide layer
4 Device layer
5 Mode converter layer
6 Substrate
7 Oxide layer
8 Cavity in device layer
9 New oxide layer
10 Oxide isolation region
11 Oxidation barrier
12a, 12b Isolation trenches
13a, 13b Tapered waveguide cladding layers
14 Overgrown region
15 Regrown region
16 Rib waveguide
17a, 17b First and second channels
18 Fiber optic cable cladding
19 Fiber optic cable core
20 Fiber optic cable, optical fiber
21 V-groove
22 Input facet
24a, 24b Rib waveguide sidewalls
25 Opening in upper oxide layer
100 Mode converter
101 Overhanging portion
102 Tapered waveguide
305 First tapered waveguide width
306 Second tapered waveguide width
602 Dry etched facet
701 Height of rib waveguide
702 Height of device layer
705 Saw cut, trench
710 End wall
715 Fiber end facet
720 V-groove bottom

The invention claimed is:

1. An optical fiber adapter, formed on a wafer including a double silicon-on-insulator (DSOI) layer structure, the optical fiber adapter comprising:
a substrate, above which is a lower buried oxide layer;
a mode converter layer, which is above the lower buried oxide layer, and includes a tapered waveguide, cladded on a first side of the tapered waveguide by a first cladding layer, and cladded on a second side of the tapered waveguide by a second cladding layer;
an upper buried oxide layer, which is above the mode converter layer and has an opening therein above the tapered waveguide;
a device layer, which is above the upper buried oxide layer, and includes two etched portions which define a rib waveguide;
a waveguide facet at an end of the tapered waveguide and the rib waveguide; and
a V-groove, the V-groove being configured to support an optical fiber having an optical mode overlapping the waveguide facet,
wherein a width of the tapered waveguide at a point along the tapered waveguide is less than a width of a rib of the rib waveguide at a corresponding point along the rib waveguide.

2. The optical fiber adapter of claim 1, further comprising a trench having a first wall, the first wall being configured to position a fiber end facet abutting against the first wall to be separated from the waveguide facet by a gap.

3. The optical fiber adapter of claim 2, wherein the gap is greater than 3 microns and less than 100 microns.

4. The optical fiber adapter of claim 2, wherein the trench is perpendicular, to within 20 degrees, of the V-groove.

5. The optical fiber adapter of claim 2, wherein the trench has a depth of between 100 microns and 200 microns, and a width of between 50 microns and 150 microns.

6. The optical fiber adapter of claim 1, wherein an angle between the waveguide facet and a plane perpendicular to the V-groove is at least 0.5 degrees.

7. The optical fiber adapter of claim 6, wherein the angle between the waveguide facet and the plane perpendicular to the V-groove is at most 6 degrees.

8. The optical fiber adapter of claim 6, wherein an angle between:
the V-groove and
a centerline of the rib waveguide and the tapered waveguide is at least 1 degree.

9. The optical fiber adapter of claim 8, wherein the ratio of
the sine of the angle between the waveguide facet and the plane perpendicular to the V-groove and
the sine of the angle between a line perpendicular to the waveguide facet and a centerline of the rib waveguide and the tapered waveguide is within 20% of 2.2.

10. A system, comprising:
the optical fiber adapter of claim 1; and
an optical fiber, in the V-groove,
the system being configured to couple light between the optical fiber, and
the tapered waveguide and
the rib waveguide;
with an insertion loss of less than 2 dB.

11. The system of claim 10, wherein:
the optical fiber adapter further comprises a trench having a first wall, and
the optical fiber has a fiber end facet abutting against the first wall.

12. The system of claim 10, wherein an angle between the waveguide facet and a plane perpendicular to the V-groove is at least 0.5 degrees.

13. The system of claim 12, wherein an angle between:
the V-groove, and
a centerline of the rib waveguide and the tapered waveguide is at least 1 degree.

14. The system of claim 13, wherein an optical return loss for light propagating in the tapered waveguide and the rib waveguide toward the waveguide facet is greater than 10 dB.

15. The system of claim 10, wherein the optical fiber has a fiber end facet, an angle between a normal vector of the fiber end facet and the optical fiber being at least 0.5 degrees.

16. The system of claim 15, wherein an optical return loss for light propagating in the optical fiber toward the fiber end facet is greater than 15 dB.

17. An optical fiber adapter, formed on a wafer including a double silicon-on-insulator (DSOI) layer structure, the optical fiber adapter comprising:
  a substrate, above which is a lower buried oxide layer;
  a mode converter layer, which is above the lower buried oxide layer, and includes a tapered waveguide, cladded on a first side of the tapered waveguide by a first cladding layer, and cladded on a second side of the tapered waveguide by a second cladding layer;
  an upper buried oxide layer, which is above the mode converter layer and has an opening therein above the tapered waveguide;
  a device layer, which is above the upper buried oxide layer, and includes two etched portions which define a rib waveguide, the rib waveguide comprising a rib and a slab region adjacent to the rib;
  a waveguide facet at an end of the tapered waveguide and the rib waveguide; and
  a V-groove, the V-groove being configured to support an optical fiber having an optical mode overlapping the waveguide facet.

18. An optical fiber adapter, formed on a wafer including a double silicon-on-insulator (DSOI) layer structure, the optical fiber adapter comprising:
  a substrate, above which is a lower buried oxide layer;
  a mode converter layer, which is above the lower buried oxide layer, and includes a tapered waveguide, cladded on a first side of the tapered waveguide by a first cladding layer, and cladded on a second side of the tapered waveguide by a second cladding layer;
  an upper buried oxide layer, which is above the mode converter layer and has an opening therein above the tapered waveguide;
  a device layer, which is above the upper buried oxide layer, and includes two etched portions which define a rib waveguide;
  a waveguide facet at an end of the tapered waveguide and the rib waveguide;
  a V-groove, the V-groove being configured to support an optical fiber having an optical mode overlapping the waveguide facet; and
  a trench having a first wall, the first wall being configured to position a fiber end facet abutting against the first wall to be separated from the waveguide facet by a gap.

19. The optical fiber adapter of claim 18, wherein the trench is perpendicular, to within 20 degrees, of the V-groove.

20. An optical fiber adapter, formed on a wafer including a double silicon-on-insulator (DSOI) layer structure, the optical fiber adapter comprising:
  a substrate, above which is a lower buried oxide layer;
  a mode converter layer, which is above the lower buried oxide layer, and includes a tapered waveguide, cladded on a first side of the tapered waveguide by a first cladding layer, and cladded on a second side of the tapered waveguide by a second cladding layer;
  an upper buried oxide layer, which is above the mode converter layer and has an opening therein above the tapered waveguide;
  a device layer, which is above the upper buried oxide layer, and includes two etched portions which define a rib waveguide;
  a waveguide facet at an end of the tapered waveguide and the rib waveguide; and
  a V-groove, the V-groove being configured to support an optical fiber having an optical mode overlapping the waveguide facet,
  wherein an angle between the waveguide facet and a plane perpendicular to the V-groove is at most 15 degrees.

* * * * *